US012334768B2

(12) United States Patent
Kim et al.

(10) Patent No.: US 12,334,768 B2
(45) Date of Patent: Jun. 17, 2025

(54) ELECTRONIC DEVICE COMPRISING BATTERY, AND BATTERY CHARGING METHOD THEREFOR

(71) Applicant: SAMSUNG ELECTRONICS CO., LTD., Suwon-si (KR)

(72) Inventors: Yeongil Kim, Suwon-si (KR); Sanghyun Ryu, Suwon-si (KR); Hyunjun Oh, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 169 days.

(21) Appl. No.: 18/105,621

(22) Filed: Feb. 3, 2023

(65) Prior Publication Data

US 2023/0179008 A1    Jun. 8, 2023

Related U.S. Application Data

(63) Continuation of application No. PCT/KR2021/010048, filed on Aug. 2, 2021.

(30) Foreign Application Priority Data

Aug. 5, 2020 (KR) .................. 10-2020-0097718

(51) Int. Cl.
    *G06F 1/26*     (2006.01)
    *H02J 7/00*     (2006.01)
(52) U.S. Cl.
    CPC ............ *H02J 7/00712* (2020.01); *G06F 1/26* (2013.01); *H02J 7/0048* (2020.01)
(58) Field of Classification Search
    CPC ..................................... G06F 1/26; G06F 1/32
    See application file for complete search history.

(56) References Cited

U.S. PATENT DOCUMENTS 8,754,614 B2 * 6/2014 Paryani ............... H01M 10/443
                                                320/160
8,970,182 B2   3/2015 Paryani et al.
               (Continued)

FOREIGN PATENT DOCUMENTS

JP         3641885 B2    4/2005
JP      2013-131426 A    7/2013
               (Continued)

OTHER PUBLICATIONS

International Search Report dated Nov. 26, 2021, issued by the International Searching Authority in International Application No. PCT/KR2021/010048 (PCT/ISA/210).
(Continued)

*Primary Examiner* — Phil K Nguyen
(74) *Attorney, Agent, or Firm* — Sughrue Mion, PLLC

(57) ABSTRACT

An electronic device includes: a battery; a power management module configured to control the battery; a memory storing a plurality of state-of-charge reference values related to a charging cycle of the battery; at least one processor configured to: control the power management module to charge the battery such that a charging section of the battery alternately includes a plurality of constant current sections, in which charging is performed with a uniform current, and a plurality of constant voltage sections, in which charging is performed with a uniform voltage, identify the charging cycle of the battery, and set a condition for changing from one constant voltage section of the plurality of constant voltage sections to a constant current section following the one constant voltage section of the plurality of constant current sections, based on a state-of-charge reference value corresponding to the identified charging cycle of the battery from among the plurality of state-of-charge reference values stored in the memory.

18 Claims, 9 Drawing Sheets

(56) References Cited

U.S. PATENT DOCUMENTS

| | | | |
|---|---|---|---|
| 9,293,940 B2 | 3/2016 | Lim et al. | |
| 9,627,920 B2 | 4/2017 | Yun | |
| 9,634,497 B2 | 4/2017 | Baek et al. | |
| 9,917,458 B2 | 3/2018 | Lee et al. | |
| 10,069,327 B2 | 9/2018 | Lee et al. | |
| 10,355,510 B2 | 7/2019 | Kim et al. | |
| 11,489,358 B2 | 11/2022 | Jung | |
| 11,539,229 B2* | 12/2022 | Zhang | H02J 7/0047 |
| 2004/0051498 A1* | 3/2004 | Kim | H02J 7/0018 |
| | | | 320/103 |
| 2009/0112496 A1* | 4/2009 | Suzuki | H02J 7/0013 |
| | | | 702/63 |
| 2011/0156661 A1* | 6/2011 | Mehta | H02J 7/0071 |
| | | | 320/160 |
| 2013/0082664 A1* | 4/2013 | Hiraoka | H01M 10/486 |
| | | | 320/152 |
| 2013/0314053 A1* | 11/2013 | Iwasaki | H01M 10/44 |
| | | | 320/162 |
| 2015/0134172 A1* | 5/2015 | Ose | H01M 10/0481 |
| | | | 701/22 |
| 2015/0171644 A1 | 6/2015 | Paryani et al. | |
| 2016/0020620 A1* | 1/2016 | Lee | H02J 7/007182 |
| | | | 320/162 |
| 2016/0226270 A1* | 8/2016 | Kim | H02J 7/00714 |
| 2017/0194797 A1 | 7/2017 | Jung | |
| 2018/0048165 A1* | 2/2018 | Shiraishi | H01M 10/425 |
| 2022/0026494 A1 | 1/2022 | Lee et al. | |

FOREIGN PATENT DOCUMENTS

| | | | |
|---|---|---|---|
| JP | 2015-171275 A | 9/2015 | |
| KR | 10-2016-0024589 A | 3/2016 | |
| KR | 10-2016-0095752 A | 8/2016 | |
| KR | 10-2017-0022778 A | 3/2017 | |
| KR | 10-2017-0025484 A | 3/2017 | |
| KR | 10-1723998 | 4/2017 | |
| KR | 10-2018-0005345 A | 1/2018 | |
| KR | 10-2020-0058067 A | 5/2020 | |
| KR | 10-2358435 B1 | 2/2022 | |

OTHER PUBLICATIONS

Written Opinion dated Nov. 26, 2021, issued by the International Searching Authority in counterpart International Application No. PCT/KR2021/010048 (PCT/ISA/237).

* cited by examiner

| STEP | VOLTAGE(V) | CHARGING CURRENT(A) | SOC(%) |
|---|---|---|---|
| 1 | SMALLER THAN FIRST VOLTAGE | GREATER THAN SECOND CURRENT AND SMALLER THAN OR EQUAL TO FIRST CURRENT | GREATER THAN OR EQUAL TO 0 AND SMALLER THAN FIRST SOC REFERENCE VALUE |
| 2 | SMALLER THAN SECOND VOLTAGE | GREATER THAN THIRD CURRENT AND SMALLER THAN OR EQUAL TO SECOND CURRENT | GREATER THAN OR EQUAL TO FIRST SOC VALUE AND SMALLER THAN SECOND SOC REFERENCE VALUE |
| 3 | SMALLER THAN THIRD VOLTAGE | GREATER THAN END-OF-CHARGE CURRENT AND SMALLER THAN OR EQUAL TO THIRD CURRENT | GREATER THAN OR EQUAL TO SECOND SOC REFERENCE VALUE AND SMALLER THAN 100% |

| CHARGING CYCLE | 1st SOC | 2nd SOC |
|---|---|---|
| FIRST RANGE | FIRST SOC REFERENCE VALUE | SECOND SOC REFERENCE VALUE |
| SECOND RANGE | THIRD SOC REFERENCE VALUE | FOURTH SOC REFERENCE VALUE |
| ⋮ | ⋮ | ⋮ |
| N-TH RANGE | (2N-1)-TH SOC REFERENCE VALUE | 2N-TH SOC REFERENCE VALUE |
| ⋮ | ⋮ | ⋮ |

FIG.5

ELECTRONIC DEVICE COMPRISING BATTERY, AND BATTERY CHARGING METHOD THEREFOR

CROSS-REFERENCE TO RELATED APPLICATIONS

This application is a by-pass continuation application of International Application No. PCT/KR2021/010048, filed on Aug. 2, 2021, which based on and claims priority to Korean Patent Application No. 10-2020-0097718, filed on Aug. 5, 2020, in the Korean Intellectual Property Office, the disclosures of which are incorporated by reference herein in their entireties.

BACKGROUND

1. Field

The disclosure relates to an electronic device including a battery and a battery charging method thereof.

2. Description of Related Art

An electronic device may operate with a power supplied from a charged battery for a given time even in a state of being separated from an external power source. When the battery is discharged, the electronic device may charge the discharged battery through a connection with the external power source.

The electronic device may charge the battery depending on a plurality of steps while alternately having a constant voltage section in which a voltage of the battery is uniformly maintained or a constant current section in which a charging current of the battery (e.g., a charging current introduced into the battery) is uniformly maintained. In an initial charging stage in which the voltage of the battery is low, the electronic device may charge the battery at high speed, with the charging current maintained highly; as the voltage of the battery increases, the charging current gradually decreases. As such, the battery may be stably charged.

The electronic device uses the voltage of the battery or the charging current of the battery as an indicator being a condition for changing from the constant voltage section of a previous step to the constant current section of a next step. However, in a case of using only the voltage of the battery or the charging current of the battery as the indicator, there may be a problem with the flexibility of the voltage and the charging current.

Also, as the charging cycle increases, the battery of the electronic device may be degraded; in this case, when the battery of the electronic device is charged, an increase in a state of charge (SoC) of the battery is slowed down, resulting in inefficiency in the charging time.

SUMMARY

According to an aspect of the disclosure, an electronic device includes: a battery; a power management module configured to control the battery; a memory storing one or more instructions and a plurality of state-of-charge reference values related to a charging cycle of the battery; at least one processor operatively connected with the battery, the power management module, and the memory, wherein the at least one processor is configured to execute the one or more instructions to: control the power management module to charge the battery such that a charging section of the battery alternately includes a plurality of constant current sections, in which charging is performed with a uniform current, and a plurality of constant voltage sections, in which charging is performed with a uniform voltage, identify the charging cycle of the battery, and set a condition for changing from one constant voltage section of the plurality of constant voltage sections to a constant current section following the one constant voltage section of the plurality of constant current sections, based on a state-of-charge reference value corresponding to the identified charging cycle of the battery from among the plurality of state-of-charge reference values stored in the memory.

The plurality of state-of-charge reference values may include a first state-of-charge reference value and a second state-of-charge reference value, and the at least one processor may be further configured to execute the one or more instructions to: identify a state of charge of the battery, set that the identified state of charge of the battery is greater than or equal to the first state-of-charge reference value, as a condition for changing from a first constant voltage section to a second constant current section following the first constant voltage section, and set that the identified state of charge of the battery is greater than or equal to the second state-of-charge reference value, as a condition for changing from a second constant voltage section to a third constant current section following the second constant voltage section.

As the charging cycle of the battery increases, the plurality of state-of-charge reference values may decrease.

The charging cycle of the battery may include a first cycle and a second cycle that is greater than the first cycle, the at least one processor may be further configured to execute the one or more instructions to: in the first cycle, set that the identified state of charge of the battery is greater than or equal to the first state-of-charge reference value, as the condition for changing from the first constant voltage section to the second constant current section, and set that the identified state of charge of the battery is greater than or equal to the second state-of-charge reference value, as the condition for changing from the second constant voltage section to the third constant current section, and in the second cycle, set that the identified state of charge of the battery is greater than or equal to a third state-of-charge reference value smaller than the first state-of-charge reference value, as the condition for changing from the first constant voltage section to the second constant current section, and set that the identified state of charge of the battery is greater than or equal to a fourth state-of-charge reference value smaller than the second state-of-charge reference value, as the condition for changing from the second constant voltage section to the third constant current section.

The at least one processor may be further configured to execute the one or more instructions to set a voltage of the battery and a charging current of the battery, as a condition for changing from a first constant voltage section to a second constant current section following the first constant voltage section.

The condition for changing from the first constant voltage section to the second constant current section may be that the voltage of the battery is greater than or equal to a set voltage, the charging current of the battery is smaller than or equal to a set current, and the state of charge of the battery is greater than or equal to a set state-of-charge reference value.

The at least one processor may be further configured to execute the one or more instructions to set a target voltage of the battery, as a condition for changing from a first constant current section to a first constant voltage section following the first constant current section, and the condition for changing from the first constant current section to the first constant voltage section may be that a voltage of the battery reaches the target voltage.

The at least one processor may be further configured to execute the one or more instructions to: charge the battery through the power management module depending on a plurality of steps, wherein a constant current section of a first step of the plurality of steps is adjacent to a constant voltage section of the first step, and the constant voltage section of the first step is adjacent to a constant current section of a second step of the plurality of steps, and set a condition for changing from the constant current section of the first step to the constant voltage section of the first step and a condition for changing from the constant voltage section of the first step to the constant current section of the second step.

The electronic device may further include communication circuitry operatively connected with the at least one processor, the at least one processor may be further configured to execute the one or more instructions to: receive the plurality of state-of-charge reference values depending on the charging cycle of the battery from an external device through the communication circuitry, and store the received plurality of state-of-charge reference values in the memory.

The at least one processor may be further configured to execute the one or more instructions to change at least one of the plurality of state-of-charge reference values stored in the memory.

According to an aspect of the disclosure, a method of charging a battery of an electronic device while alternately having a plurality of constant current sections and a plurality of constant voltage sections, includes: charging the battery with a uniform voltage through a power management module of the electronic device; identifying a charging cycle of the battery; determining whether a state of charge of the battery is greater than or equal to a state-of-charge reference value corresponding to the identified charging cycle of the battery; and based on the state of charge being greater than or equal to the state-of-charge reference value corresponding to the identified charging cycle, charging the battery with a uniform current through the power management module.

The charging the battery may include: in a first constant current section, charging the battery while maintaining a charging current of the battery at a first current through the power management module; in a first constant voltage section, charging the battery while maintaining a voltage of the battery at a first voltage through the power management module; based on the state of charge being greater than or equal to a first state-of-charge reference value corresponding to the identified charging cycle, changing from the first constant voltage section to a second constant current section; in the second constant current section, charging the battery while maintaining the charging current at a second current smaller in magnitude than the first current through the power management module; in a second constant voltage section, charging the battery while maintaining the voltage at a second voltage greater in magnitude than the first voltage through the power management module; based on the state of charge being greater than or equal to a second state-of-charge reference value corresponding to the identified charging cycle, changing from the second constant voltage section to a third constant current section; and in the third constant current section, charging the battery while maintaining the charging current at a third current smaller in magnitude than the second current through the power management module.

As the charging cycle of the battery increases, the state-of-charge reference value may decrease.

The charging cycle of the battery may include a first cycle and a second cycle that is greater than the first cycle, the charging the battery may include: in the first cycle, based on the state of charge being greater than or equal to the first state-of-charge reference value, changing from the first constant voltage section to the second constant current section; and based on the state of charge being greater than or equal to the second state-of-charge reference value, changing from the second constant voltage section to the third constant current section, and in the second cycle, based on the state of charge being greater than or equal to a third state-of-charge reference value smaller than the first state-of-charge reference value, changing from the first constant voltage section to the second constant current section; and based on the state of charge being greater than or equal to a fourth state-of-charge reference value smaller than the second state-of-charge reference value, changing from the second constant voltage section to the third constant current section.

The method may further include: determining whether a voltage of the battery is greater than or equal to a set voltage; determining whether a charging current of the battery is smaller than or equal to a set current; and based on the voltage being greater than or equal to the set voltage, the charging current is smaller than or equal to the set current, and the state of charge being greater than or equal to the state-of-charge reference value corresponding to the identified charging cycle of the battery, changing from a first constant voltage section to a second constant current section.

According to one or more embodiments of the disclosure, when an electronic device charges a battery depending on a plurality of steps, the electronic device may supplement flexibility due to a voltage or a current by further using a state of charge of the battery as an indicator of a condition for switching from a constant voltage section of a previous step to a constant current section of a next step.

Also, according to one or more embodiments of the disclosure, as the electronic device performs the charging of the battery such that the transition from the constant voltage section of the previous step to the constant current section of the next step is made based on a state-of-charge reference value decreasing as a charging cycle of the battery increases, a total of charging time necessary to fully charge a degraded battery may decrease, and the amount of charging that is made during the same time may increase.

Further, a variety of effects directly or indirectly understood through this disclosure may be provided.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4B is a table for describing a method in which an electronic device according to an embodiment charges a battery;

FIG. 5 is a table illustrating a method in which an electronic device according to an embodiment charges a battery;

With regard to description of drawings, the same or similar components will be marked by the same or similar reference signs.

DETAILED DESCRIPTION

Figure 1:
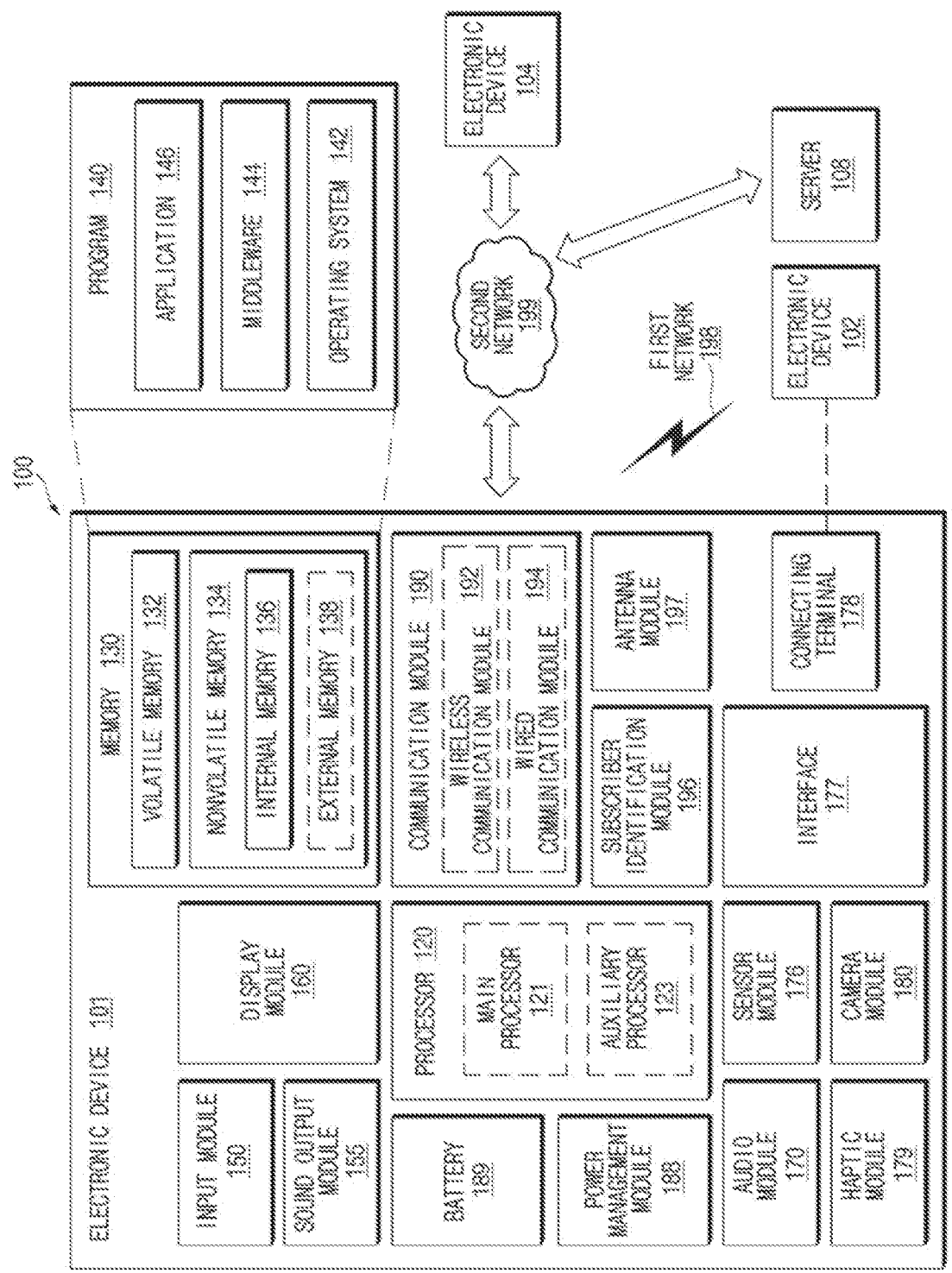
FIG. 1 is a block diagram illustrating an electronic device in a network environment according to one or more embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
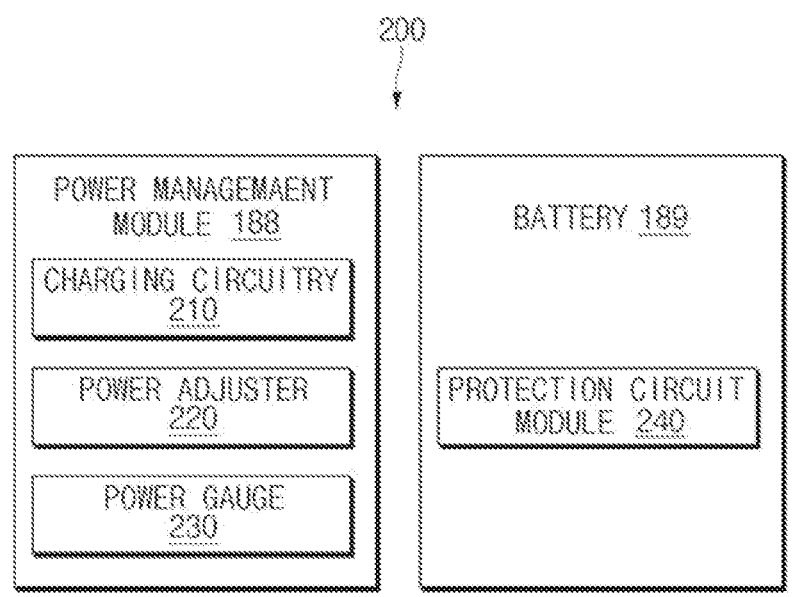
FIG. 2 is a block diagram illustrating a power management module and a battery of an electronic device according to one or more embodiments.

FIG. 2 is a block diagram 200 illustrating the power management module 188 and the battery 189 according to various embodiments. Referring to FIG. 2, the power management module 188 may include charging circuitry 210, a power adjuster 220, or a power gauge 230. The charging circuitry 210 may charge the battery 189 by using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator. The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a Protection Circuit Module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

Figure 3:
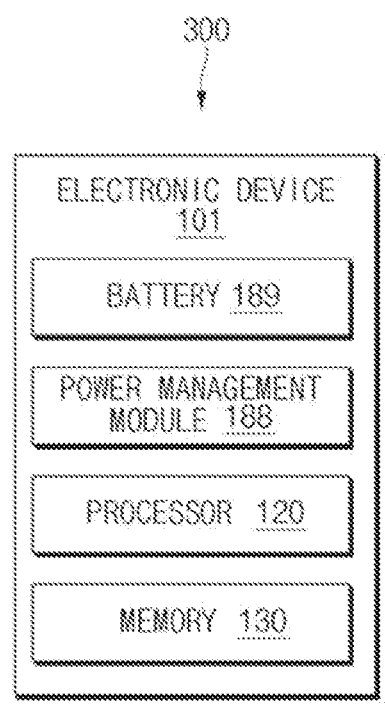
FIG. 3 is a block diagram illustrating an electronic device according to an embodiment.

FIG. 3 is a block diagram 300 illustrating the electronic device 101 according to an embodiment. Referring to FIG.

3, the electronic device 101 may include the battery 189, the power management module 188, the processor 120, and the memory 130.

According to an embodiment, the battery 189 may supply the power to the electronic device 101. The battery 189 may supply the power such that the electronic device 101 is able to operate, even with the electronic device 101 is not connected with an external power source; as the battery 189 supplies the power to the electronic device 101, the battery 189 may be gradually discharged. According to an embodiment, when the electronic device 101 is connected with the external power source, the electronic device 101 may charge the discharged battery 189.

According to an embodiment, the power management module 188 may manage the power that is supplied to the electronic device 101. According to the description given with reference to FIG. 2, the power management module 188 may include the charging circuitry 210, the power adjuster 220, or the power gauge 230.

According to an embodiment, the charging circuitry 210 may charge the battery 189 by using the power supplied from the external power source connected with the electronic device 101. The charging circuitry 210 may charge the battery 189 by allowing the charging current to flow to the battery 189.

According to an embodiment, the power gauge 230 may measure a charging cycle of the battery 189. In the specification, the charging cycle may mean the number of times of charging/discharging. According to an embodiment, the power gauge 230 may measure the state of charge of the battery 189. In the specification, the state of charge of the battery 189 may mean a ratio of a battery charging amount (or level) to a battery capacity and may be calculated, for example, in units of percentage (%).

According to an embodiment, the power management module 188 may control the charging or discharging of the battery 189, based on at least part of information about the use state of the battery 189 measured by using the charging circuitry 210, the power adjuster 220, or the power gauge 230. For example, the power management module 188 may adjust the voltage or charging current of the battery 189 when the battery 189 is charged.

According to an embodiment, the power management module 188 may charge the battery 189 such that a battery charging section alternately includes a plurality of constant current (CC) sections for charging the battery 189 with a uniform current and a plurality of constant voltage (CV) sections for charging the battery 189 with a uniform voltage.

According to an embodiment, the charging section of the battery 189 may mean a time from a time when the electronic device 101 starts the charging of the battery 189 to a time when the electronic device 101 stops the charging of the battery 189. For example, when the electronic device 101 fully charges the discharged battery 189, the charging section of the battery 189 may correspond to a time taken for the state of charge of the battery 189 to increase from 0% to 100%.

According to an embodiment, the charging section of the battery 189 may be classified as a constant current section or a constant voltage section depending on a way for the electronic device 101 to charge the battery 189. According to an embodiment, in the constant current section, the electronic device 101 may increase the voltage of the battery 189 while maintaining the charging current of the battery 189 (e.g., the charging current flowing to the battery 189) uniformly; in the constant voltage section, the electronic device 101 may gradually decrease the charging current of the battery 189 while maintaining the voltage of the battery 189 uniformly.

For example, the power management module 188 may charge the battery 189 such that the charging section of the battery 189 sequentially includes a first constant current section, a first constant voltage section, a second constant current section, a second constant voltage section, a third constant current section, and a third constant voltage section. The power management module 188 may increase the voltage of the battery 189 while maintaining the charging current of the battery 189 uniformly in the first constant current section, the second constant current section, and the third constant current section, and may decrease the charging current of the battery 189 uniformly while maintaining the voltage of the battery 189 uniformly in the first constant voltage section, the second constant voltage section, and the third constant voltage section.

According to an embodiment, the power management module 188 may control operations of the plurality of constant voltage sections, operations of the plurality of constant current sections, and a change between sections. The power management module 188 may operate in the constant voltage section by maintaining the voltage of the battery 189 uniformly, may operate in the constant current section by maintaining the charging current of the battery 189 uniformly, may control the charging method of the battery 189 such that the charging current is maintained uniformly and the voltage is then maintained uniformly when a specified condition is satisfied, that is, such that the change from the constant current section to the constant voltage section is made when the specified condition is satisfied, and may control the charging method of the battery 189 such that the voltage is maintained uniformly and the charging current is then maintained uniformly when a specified condition is satisfied, that is, such that the change from the constant voltage section to the constant voltage section is made when the specified condition is satisfied.

According to an embodiment, the power management module 188 may charge the battery 189 depending on a plurality of steps. The power management module 188 may charge the battery 189 based on the voltage, the charging current, and the state of charge of the battery 189, which are set for each step.

The voltage of the battery 189 set for each step may be a maximum voltage value of the battery 189 in the corresponding step; the charging current of the battery 189 set for each step may be a maximum charging current value of the battery 189 in the corresponding step; the state of charge of the battery 189 set for each step may be a state-of-charge range of the battery 189 in the corresponding step. As the step increases, the set voltage of the battery 189 may increase, the charging current may decrease, and the state of charge may increase.

According to an embodiment, the electronic device 101 may include one constant current section and one constant voltage section in each of the plurality of steps. For example, the electronic device 101 may have the first constant current section and the first constant voltage section in the first step, may have the second constant current section and the second constant voltage section in the second step, and may have the third constant current section and the third constant voltage section in the third step.

In this case, the first constant current section of the first step may be adjacent to the first constant voltage section of the first step; the first constant voltage section of the first step may be adjacent to the second constant current section of the second step following the first step; the second constant current section of the second step may be adjacent to the second constant voltage section of the second step; the second constant voltage section of the second step may be adjacent to the third constant current section of the third step following the second step; the third constant current section of the third step may be adjacent to the third constant voltage section of the third step.

According to an embodiment, at least some of the constant current sections and the constant voltage sections included in the plurality of steps may have different lengths (e.g., times (or time sections)). For example, at least some of the first constant current section and the first constant voltage section of the first step, the second constant current section and the second constant voltage section of the second step, and/or the third constant current section and the third constant voltage section of the third step may have different lengths (e.g., times (or time sections)).

According to an embodiment, the power management module 188 may operate in the constant current section or the constant voltage section for each step based on the voltage, the charging current, and the state of charge of the battery 189 set for each step and may control the switch from the constant current section to the constant voltage section or the switch from the constant voltage section to the constant current section.

According to an embodiment, the processor 120 may be operatively connected with the battery 189 and the power management module 188. The processor 120 may obtain information about the battery 189 or information about the charging or discharging of the battery 189 through the power management module 188. For example, the processor 120 may obtain at least one of the charging cycle of the battery 189, the voltage of the battery 189, the charging current of the battery 189, or the state of charge of the battery 189 through the power management module 188.

According to an embodiment, through the power management module 188, the processor 120 may charge the battery 189 such that the charging section of the battery 189 alternately includes the plurality of constant current sections and the plurality of constant voltage sections.

According to an embodiment, through the power management module 188, the processor 120 may charge the battery 189 depending on the plurality of steps. According to an embodiment, through the power management module 188, the processor 120 may control operations of the plurality of constant current sections and the plurality of constant voltage sections and the change between adjacent sections, based on at least one of the voltage, the charging current, and the state of charge of the battery 189 differently set for each step.

According to an embodiment, the processor 120 may set a condition for changing from the constant current section to the constant voltage section adjacent thereto and a condition for changing from the constant voltage section to the constant current section adjacent thereto. According to an embodiment, the processor 120 may use the voltage of the battery 189 as an indicator value for changing from the constant current section to the constant voltage section adjacent thereto.

According to an embodiment, the processor 120 may use at least one of the voltage of the battery 189, the charging current of the battery 189, or the state of charge of the battery 189, as an indicator value of the condition for changing from the constant voltage section to the constant current section adjacent thereto. For example, the processor 120 may consider all of the voltage of the battery 189, the charging current of the battery 189, and the state of charge of the battery 189, as an indicator value of the condition for changing from the constant voltage section to the constant current section adjacent thereto.

According to an embodiment, the processor 120 may supplement the flexibility due to the voltage or the charging current, by further considering the state of charge of the battery 189 in addition to the voltage of the battery 189 and the charging current of the battery 189, as an indicator value of the condition for changing from the constant voltage section to the constant current section adjacent thereto.

According to an embodiment, depending on the charging cycle, the processor 120 may differently set the condition for the state of charge of the battery 189, which is used to change from the constant voltage section to the constant current section adjacent thereto.

According to an embodiment, the processor 120 may verify the charging cycle through the power management module 188. The processor 120 may set the condition for the state of charge of the battery 189 for changing from the constant voltage section to the constant current section adjacent thereto, based on a state-of-charge reference value corresponding to the identified charging cycle from among a plurality of state-of-charge reference values that are set depending on the charging cycles stored in the memory 130 to be described later. When a state of charge of a battery is greater than or equal to the state-of-charge reference value corresponding to the charging cycle, the processor 120 may be configured to change from the constant voltage section to the constant current section adjacent thereto.

According to an embodiment, the processor 120 may identify the state of charge of the battery 189 through the power management module 188. The processor 120 may determine whether the identified state of charge of the battery 189 is greater than or equal to the set state-of-charge reference value. When it is determined that the identified state of charge is greater than or equal to the set state-of-charge reference value, the processor 120 may control the power management module 188 such that the change from the constant voltage section to the constant current section is made. According to an embodiment, when that the identified state of charge is greater than or equal to the set state-of-charge reference value is determined while decreasing the charging current of the battery 189 through the power management module 188, with the voltage of the battery 189 maintained uniformly, the processor 120 may increase the voltage of the battery 189 through the power management module 188, with the charging current of the battery 189 maintained uniformly.

According to an embodiment, the memory 130 may be operatively connected with at least one processor 120. The memory 130 may store one or more instructions for performing methods according to one or more embodiments of the disclosure, the instructions allowing the at least one processor 120 to charge the battery 189.

The memory 130 may store various data that are used by the at least one processor 120. For example, the data may include a plurality of reference values for the voltage, the charging current, and the state of charge of the battery 189, which are associated with the condition for changing from the constant current section to the constant voltage section adjacent thereto or the condition for changing from the constant voltage section to the constant current section adjacent thereto.

According to an embodiment, the memory 130 may store different reference values for respective steps. For example, as the step increases, the reference values for the voltage of the battery 189 may increase, the reference values for the charging current of the battery 189 may decrease, and the reference values (i.e., the plurality of state-of-charge reference values) for the state of charge of the battery 189 may increase.

According to an embodiment, the battery 189 may store the plurality of state-of-charge reference values that are set depending on the charging cycle of the battery 189. For example, as the charging cycle increases, the plurality of state-of-charge reference values may decrease.

Figure 4A:
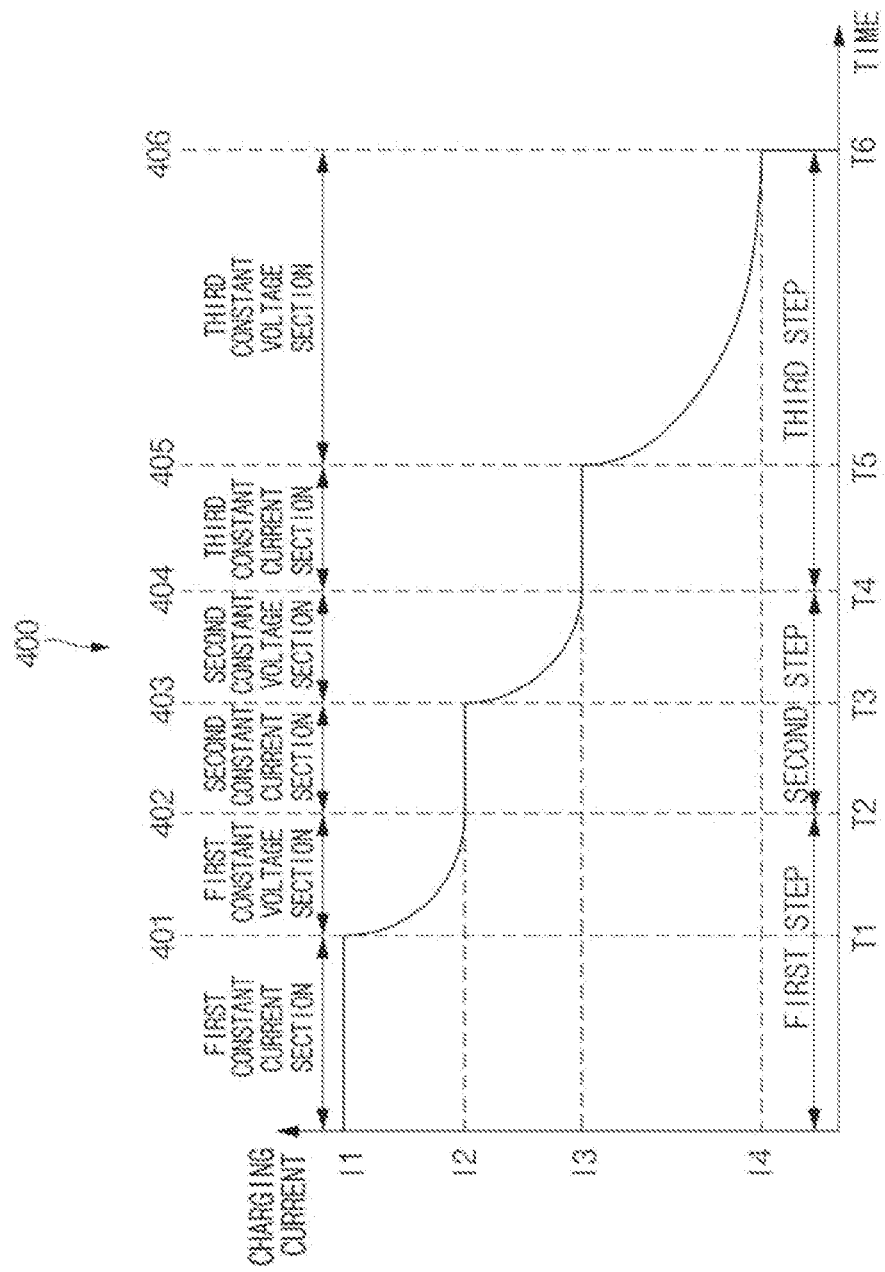
FIG. 4A is a graph illustrating a method in which an electronic device according to an embodiment charges a battery.

FIG. 4A is a graph 400 illustrating a method in which an electronic device (e.g., the electronic device 101 of FIG. 3) according to an embodiment charges a battery (e.g., the battery 189 of FIG. 3). FIG. 4B is a table 450 for describing a method in which an electronic device according to an embodiment charges a battery. Operations to be described below, which the electronic device performs to charge the battery, may be performed by a processor (e.g., the processor 120 of FIG. 3) of the electronic device.

According to an embodiment, the electronic device may charge the battery such that a charging section of the battery alternately includes a plurality of constant current sections and a plurality of constant voltage sections. Referring to FIG. 4A, the electronic device may have the charging section of the battery, which sequentially includes the first constant current section, the first constant voltage section, the second constant current section, the second constant voltage section, the third constant current section, and the third constant voltage section.

According to an embodiment, the electronic device may have the first constant current section by maintaining the magnitude of the charging current of the battery at a first current I1 uniformly through a power management module (e.g., the power management module 188 of FIG. 3). In the first constant current section, the electronic device may control the power management module such that the voltage of the battery gradually increases.

According to an embodiment, when a first condition 401 for changing from the first constant current section to the first constant voltage section is satisfied, the electronic device may control the power management module such that the change from the first constant current section to the first constant voltage section is made. According to an embodiment, a first time T1 when the electronic device changes from the first constant current section to the first constant voltage section may be a time when the electronic device determines that the first condition 401 is satisfied.

For example, the first condition 401 may be that the voltage of the battery reaches a target voltage of the first step. According to an embodiment, as it is determined, in the first constant current section, that the voltage of the battery reaches the target voltage of the first step, the electronic device may control the power management module such that the change to the first constant voltage section is made. For example, in the first constant current section, the electronic device may periodically determine whether the condition for changing from the first constant current section to the first constant voltage section is satisfied (e.g., whether the voltage of the battery reaches the target voltage of the first step).

According to an embodiment, the electronic device may have the first constant voltage section by maintaining the magnitude of the voltage of the battery uniformly through the power management module. Through the power management module, the electronic device may maintain the magnitude of the voltage of the battery at the target voltage (i.e., the first voltage) of the first step. In the first constant voltage section, the electronic device may control the power management module such that the magnitude of the charging current of the battery gradually decreases from the first current I1 to a second current I2.

According to an embodiment, when a second condition 402 for changing from the first constant voltage section to the second constant current section is satisfied, the electronic device may control the power management module such that the change from the first constant voltage section to the second constant current section is made. According to an embodiment, a second time T2 when the electronic device changes from the first constant voltage section to the second constant current section may be a time when the electronic device determines that the second condition 402 is satisfied.

The second condition 402 may be, for example, that the voltage of the battery is greater than or equal to the set voltage, the charging current of the battery is smaller than or equal to the set current, and the state of charge of the battery is greater than or equal to the set state-of-charge reference value. According to an embodiment, as it is determined, in the first constant voltage section, that the voltage of the battery is greater than or equal to the first voltage, the charging current of the battery is smaller than or equal to the second current, and the state of charge of the battery is greater than or equal to the first state-of-charge reference value, the electronic device may control the power management module such that the change to the second constant current section is made. For example, in the first constant voltage section, the electronic device may periodically determine whether the condition for changing from the first constant voltage section to the second constant current section is satisfied (e.g., whether the voltage of the battery is greater than or equal to the first voltage, the charging current of the battery is smaller than or equal to the second current, and the state of charge of the battery is greater than or equal to the first state-of-charge reference value).

According to an embodiment, the electronic device may have the second constant current section by maintaining the magnitude of the charging current of the battery at the second current I2 uniformly through the power management module. In the second constant current section, the electronic device may control the power management module such that the voltage of the battery gradually increases.

According to an embodiment, when a third condition 403 for changing from the second constant current section to the second constant voltage section is satisfied, the electronic device may control the power management module such that the change from the second constant current section to the second constant voltage section is made. According to an embodiment, a third time T3 when the electronic device changes from the second constant current section to the second constant voltage section may be a time when the electronic device determines that the third condition 403 is satisfied.

The third condition 403 may be, for example, that the voltage of the battery reaches a target voltage (i.e., a second voltage) of the second step. Herein, the magnitude of the target voltage (i.e., the second voltage) of the second step may be greater than the magnitude of the target voltage (i.e., the first voltage) of the first step.

According to an embodiment, as it is determined, in the second constant current section, that the voltage of the battery reaches the target voltage of the second step, the electronic device may control the power management module such that the change to the second constant voltage section is made. For example, in the second constant current section, the electronic device may periodically determine whether the condition for changing from the second constant current section to the second constant voltage section is satisfied (e.g., whether the voltage of the battery reaches the target voltage of the second step).

According to an embodiment, the electronic device may have the second constant voltage section by maintaining the magnitude of the voltage of the battery uniformly through the power management module. Through the power management module, the electronic device may maintain the magnitude of the voltage of the battery at the target voltage (i.e., the second voltage) of the second step. In the second constant voltage section, the electronic device may control the power management module such that the magnitude of the charging current of the battery gradually decreases from the second current I2 to a third current I3.

According to an embodiment, when a fourth condition 404 for changing from the second constant voltage section to the third constant current section is satisfied, the electronic device may control the power management module such that the change from the second constant voltage section to the third constant current section is made. According to an embodiment, a fourth time T4 when the electronic device changes from the second constant voltage section to the third constant current section may be a time when the electronic device determines that the fourth condition 404 is satisfied.

The fourth condition 404 may be, for example, that the voltage of the battery is greater than or equal to the second voltage, the charging current of the battery is smaller than or equal to the third current, and the state of charge of the battery is greater than or equal to the second state-of-charge reference value.

Herein, the magnitude of the second voltage of the fourth condition 404 may be greater than the magnitude of the first voltage of the second condition 402. Also, the magnitude of the third current of the fourth condition 404 may be smaller than the magnitude of the second current of the second condition 402. Also, the magnitude of the second state-of-charge reference value of the fourth condition 404 may be greater than the magnitude of the first state-of-charge reference value of the second condition 402.

According to an embodiment, as it is determined, in the second constant voltage section, that the voltage of the battery is greater than or equal to the second voltage, the charging current of the battery is smaller than or equal to the third current, and the state of charge of the battery is greater than or equal to the second state-of-charge reference value, the electronic device may control the power management module such that the change to the third constant current section is made. For example, in the second constant voltage section, the electronic device may periodically determine whether the condition for changing from the second constant voltage section to the third constant current section is satisfied (e.g., whether the voltage of the battery is greater than or equal to the second voltage, the charging current of the battery is smaller than or equal to the third current, and the state of charge of the battery is greater than or equal to the second state-of-charge reference value).

According to an embodiment, the electronic device may have the third constant current section by maintaining the magnitude of the charging current of the battery at the third current I3 uniformly through the power management module. In the third constant current section, the electronic device may control the power management module such that the voltage of the battery gradually increases.

According to an embodiment, when a fifth condition 405 for changing from the third constant current section to the third constant voltage section is satisfied, the electronic device may control the power management module such that the change from the third constant current section to the third constant voltage section is made. According to an embodiment, a fifth time T5 when the electronic device changes from the third constant current section to the third constant voltage section may be a time when the electronic device determines that the fifth condition 405 is satisfied.

The fifth condition 405 may be, for example, that the voltage of the battery reaches a target voltage (i.e., a third voltage) of the third step. Herein, the magnitude of the target voltage (i.e., the third voltage) of the third step may be greater than the magnitude of the target voltage (i.e., the second voltage) of the second step.

According to an embodiment, as it is determined, in the third constant current section, that the voltage of the battery reaches the target voltage of the third step, the electronic device may control the power management module such that the change to the third constant voltage section is made. For example, in the third constant current section, the electronic device may periodically determine whether the condition for changing from the third constant current section to the third constant voltage section is satisfied (e.g., whether the voltage of the battery reaches the target voltage of the third step).

According to an embodiment, the electronic device may have the third constant voltage section by maintaining the magnitude of the voltage of the battery uniformly through the power management module. Through the power management module, the electronic device may maintain the magnitude of the voltage of the battery at the target voltage (i.e., the third voltage) of the third step. In the third constant voltage section, the electronic device may control the power management module such that the magnitude of the charging current of the battery gradually decreases from the third current I3 to a fourth current I4.

According to an embodiment, when a sixth condition 406 for stopping the charging of the battery is satisfied, the electronic device may control the power management module such that the charging of the battery is stopped. According to an embodiment, a sixth time T6 when the electronic device stops the charging of the battery may be a time when the electronic device determines that the sixth condition 406 is satisfied. The sixth condition 406 may be, for example, that the charging current of the battery reaches the end-of-charge current I4.

According to an embodiment, as it is determined that the charging current of the battery reaches the end-of-charge current I4, the electronic device may control the power management module such that the charging current flowing to the battery is blocked. For example, in the third constant current section, the electronic device may periodically determine whether the condition for stopping the charging of the battery in the third constant voltage section is satisfied (e.g., whether the charging current of the battery reaches the end-of-charge current I4).

According to an embodiment, the electronic device may charge the battery depending on the plurality of steps. Referring to FIG. 4A, the electronic device may charge the battery depending on the first step, the second step, and the third step.

According to an embodiment, the electronic device may have one constant current section and one constant voltage section in order for each step. The electronic device may have the first constant current section and the first constant voltage section in the first step, may have the second constant current section and the second constant voltage section in the second step, and may have the third constant current section and the third constant voltage section in the third step.

Referring to FIG. 4B, the electronic device may differently set a range for the voltage, the charging current, and the state of charge of the battery for each of the plurality of steps. In the first step, the electronic device may set the range for the voltage, the charging current, and the state of charge of the battery such that the voltage of the battery is smaller than the first voltage, the charging current of the battery exceeds the second current and is smaller than or equal to the first current, and the state of charge of the battery is greater than "0" and smaller than the first state-of-charge reference value.

In the second step, the electronic device may set the range for the voltage, the charging current, and the state of charge of the battery such that the voltage of the battery is smaller than the second voltage, the charging current of the battery exceeds the third current and is smaller than the second current, and the state of charge of the battery is greater than or equal to the first state-of-charge reference value or smaller than the second state-of-charge reference value.

In the third step, under control of the electronic device, the voltage of the battery may be set to be smaller than the third voltage, the charging current of the battery may be set to exceed the end-of-charge current and to be smaller than or equal to the third current, and the state of charge of the battery may be set to be greater than or equal to the second state-of-charge reference value and to be smaller than 100%.

According to an embodiment, each of the first voltage, the second voltage, and the third voltage may be referred to as a "reference value" for the voltage of the battery in each step, each of the first current, the second current, and the third current may be referred to as a "reference value" for the charging current of the battery in each step, and each of the first state-of-charge reference value and the second state-of-charge reference value may be referred to as a "reference value" for the state of charge of the battery in each step. In one or more embodiments of the disclosure, the reference value for the voltage of the battery may be also referred to as a "target voltage of a battery".

According to an embodiment, as a step increases (e.g., from the first step to the second step or from the second step to the third step), the electronic device may allow the reference value for the voltage of the battery to increase, may allow the reference value for the charging current of the battery to decrease, and may allow the reference value for the state of charge of the battery to increase.

For example, the electronic device may set the reference value for the voltage of the battery for each step such that the magnitude of the second voltage is greater than the first voltage and the magnitude of the third voltage is greater than the second voltage. The electronic device may set the reference value for the charging current of the battery for each step such that the magnitude of the second current is smaller than the magnitude of the first current and the magnitude of the third current is smaller than the second current. The electronic device may set the reference value for the state of charge of the battery for each step such that the second state-of-charge reference value is greater than the first state-of-charge reference value.

For example, the electronic device may set the first voltage to 4.1 V, the second voltage to 4.2 V, and the third voltage to 4.3 V, may set the first current to 5 A, the second current to 4 A, and the third current to 3 A, and may set the first state-of-charge reference value to 40% and the second state-of-charge reference value to 60%. According to an embodiment, the reference values that the electronic device sets may be different depending on a physical characteristic of the battery.

According to an embodiment, the electronic device may store the reference value for the voltage of the battery, the reference value for the charging current of the battery, and the reference value for the state of charge of the battery, which are set for each step, in a memory (e.g., the memory 130 of FIG. 3).

According to an embodiment, based on the reference values for the voltage, the charging current, and the state of charge of the battery set for each step, the electronic device may set a condition for changing from the constant current section to the constant voltage section in the corresponding step or a condition for changing from the constant voltage section of the corresponding step to the constant voltage section of a next step.

According to an embodiment, the electronic device may set that the voltage of the battery reaches the target voltage, as a condition for changing from one constant current section among the plurality of constant current sections to a constant voltage section adjacent to the one constant current section. The one constant current section and the adjacent constant voltage section may belong to a next section (e.g., a next step) of the one constant current section.

For example, the electronic device may set that the voltage of the battery reaches the first voltage, as the first condition 401 of the first step; the electronic device may set that the voltage of the battery reaches the second voltage, as the third condition 403 of the second step; the electronic device may set that the voltage of the battery reaches the third voltage, as the fifth condition 405 of the third step. As such, when the voltage of the battery reaches the first voltage in the first constant current section, the electronic device may transition to the first constant voltage section; when the voltage of the battery reaches the second voltage in the second constant current section, the electronic device may transition to the second constant voltage section; when the voltage of the battery reaches the third voltage in the third constant current section, the electronic device may transition to the third constant voltage section.

According to an embodiment, the electronic device may set that the voltage of the battery is greater than or equal to the set voltage reference value, the charging current of the battery is smaller than or equal to the set charging current reference value, and the state of charge of the battery is greater than or equal to the set state-of-charge reference value, as a condition for changing from one constant voltage section among the plurality of constant voltage sections to a constant current section adjacent to the one constant voltage section. The one constant voltage section and the adjacent constant current section may belong to a next section (e.g., a next step) of the one constant voltage section.

For example, the electronic device may set that the voltage of the battery is greater than or equal to the first voltage, the charging current of the battery is smaller than the second current, and the state of charge of the battery is greater than or equal to the first state-of-charge reference value, as a condition for the transition from the first constant voltage section of the first step to the second constant current section of the second step; the electronic device may set that the voltage of the battery is greater than or equal to the second voltage, the charging current of the battery is smaller than the third current, and the state of charge of the battery is greater than or equal to the second state-of-charge reference value, as a condition for the transition from the second constant voltage section of the second step to the third constant current section of the third step.

For example, when the voltage of the battery is greater than or equal to the first voltage, the charging current of the battery is smaller than the second current, and the state of charge of the battery is greater than or equal to the first state-of-charge reference value, the electronic device may control the power management module such that the transition to the second constant current section is made; when the voltage of the battery is greater than or equal to the second voltage, the charging current of the battery is smaller than the third current, and the state of charge of the battery is greater than or equal to the second state-of-charge reference value, the electronic device may control the power management module such that the transition to the third constant current section is made.

According to the above embodiments, by further considering the state of charge of the battery, in addition to the voltage of the battery and the charging current of the battery, as a condition for changing from the first constant voltage section to the second constant current section, the electronic device may supplement the flexibility of the voltage of the battery or the charging current of the battery and may charge the battery.

According to an embodiment, as the charging cycle of the battery increases, the battery may be degraded, and the increase in the state of charge (alternatively, SoC) may be slowed when the electronic device charges the battery.

According to the above embodiments, only when the condition that the state of charge of the battery is greater than or equal to the set state-of-charge reference value is satisfied, the electronic device may change from the first constant voltage section to the second constant current section or from the second constant voltage section to the third constant current section; in this case, as the charging cycle of the battery increases, the second time T2 when the transition from the first constant voltage section to the second constant current section is made and the fourth time T4 when the transition from the second constant voltage section to the third constant current section is made may be delayed.

Also, as the second time T2 when the transition from the first constant voltage section to the second constant current section is made and the fourth time T4 when the transition from the second constant voltage section to the third constant current section is made are delayed, the charging time may increase, and the amount of charging that is made within the same time may decrease.

As an electronic device for solving the above issue, an electronic device that determines a state-of-charge reference value in consideration of the charging cycle of the battery will be described with reference to FIG. 5. FIG. 5 is a table 500 illustrating a method in which an electronic device (e.g., the electronic device 101 of FIG. 3) according to an embodiment charges a battery (e.g., the battery 189 of FIG. 3). Operations to be described below, which the electronic device performs to charge the battery, may be performed by a processor (e.g., the processor 120 of FIG. 3) of the electronic device.

Below, the electronic device charges the battery while alternately having the first constant current section, the first constant voltage section, the second constant current section, the second constant voltage section, the third constant current section, and the third constant voltage section, as illustrated in FIG. 4. It is assumed that the electronic device charges the battery depending on a total of three steps: the first step corresponding to the first constant current section and the first constant voltage section, the second step corresponding to the second constant current section and the second constant voltage section, and the third step corresponding to the third constant current section and the third constant voltage section.

According to an embodiment, the electronic device may store a plurality of state-of-charge reference values (e.g., $1^{st}$ SoC and $2^{nd}$ SoC of FIG. 5), which are set depending on the charging cycle, in a memory (e.g., the memory 130 of FIG. 3). According to an embodiment, the plurality of state-of-charge reference values stored in the memory may decrease as the charging cycle increases.

According to an embodiment, the electronic device may identify the charging cycle of the battery. The electronic device may determine (or set) a state-of-charge reference value corresponding to the identified charging cycle from among the state-of-charge reference values stored in the memory, as the reference value for the state of charge of the battery associated with the condition for changing from the constant voltage section to the constant current section adjacent thereto. The electronic device may set a condition for changing from the constant voltage section to the constant current section adjacent thereto, based on the state-of-charge reference value corresponding to the identified charging cycle from among the state-of-charge reference values stored in the memory. The electronic device may set that the state of charge of the battery is greater than or equal to the determined (or set) state-of-charge reference value, as the condition for changing from the constant voltage section to the constant current section adjacent thereto.

According to an embodiment, the state-of-charge reference value corresponding to the identified charging cycle from among the state-of-charge reference values stored in the memory may include a plurality of state-of-charge reference values. According to the above description, because the electronic device has one constant current section and one constant voltage section in order in one charging step, that the change from the constant voltage section to the constant current section being a next section thereof is made may mean that the charging step is changed. According to an embodiment, the number of state-of-charge reference values corresponding to the identified charging cycle may be calculated by "the number of battery charging steps–1".

For example, when the electronic device charges the battery depending on a total of three steps including the first step, the second step, and the third step, the number of state-of-charge reference values identified as corresponding to the charging cycle of the battery may be "2". The electronic device may set a condition for changing from the first constant voltage section to the second constant current section based on a small value among the two state-of-charge values, and may set a condition for changing from the second constant voltage section to the third constant current section based on a great value among the two state-of-charge values. In an embodiment, that the electronic device charges the battery depending on a total of three steps including the first step, the second step, and the third step is one example; according to various embodiments, a plurality of steps may include two steps or may include four or more steps. For example, when the number of a plurality of steps is "4", a plurality of state-of-charge reference voltages may include $1^{st}$ SoC, $2^{nd}$ SoC, and $3^{rd}$ SoC.

Referring to FIG. 5, when the charging cycle of the battery belongs to a first range (e.g., 0 times or more and less than 300 times), the electronic device may determine the first state-of-charge reference value and the second state-of-charge reference value, as the reference value for the state of charge of the battery; when the charging cycle of the battery belongs to a second range (e.g., 300 times or more and less than 400 times) being a range including the number of cycles more than the number of cycles of the first range, the electronic device may determine the third state-of-charge reference value smaller than the first state-of-charge reference value and the fourth state-of-charge reference value smaller than the second state-of-charge reference value, as the reference value for the state of charge of the battery.

According to an embodiment, when the charging cycle of the battery belongs to an n-th range (n being a natural number), the electronic device may determine a (2n−1)-th state-of-charge reference value and a 2n-th state-of-charge reference value, as the reference value for the state of charge of the battery. In this case, as "n" increases, the (2n−1)-th state-of-charge reference value and the 2n-th state-of-charge reference value may decrease.

According to an embodiment, the electronic device may set that the state of charge of the battery is greater than or equal to the (2n−1)-th state-of-charge reference value, as the condition for changing from the first constant voltage section to the second constant current section; the electronic device may set that the state of charge of the battery is greater than or equal to the 2n-th state-of-charge reference value, as the condition for changing from the second constant voltage section to the third constant current section.

According to an embodiment, when the state of charge of the battery is greater than or equal to the (2n−1)-th state-of-charge reference value, the electronic device may control a power management module (e.g., the power management module 188 of FIG. 3) such that the transition from the first constant voltage section to the second constant current section is made; when the state of charge of the battery is greater than or equal to the 2n-th state-of-charge reference value, the electronic device may control the power management module such that the transition from the second constant voltage section to the third constant current section is made.

According to an embodiment, the electronic device may divide the range of the charging cycle of the battery into ranges based on an interval of a specified number of times; a plurality of state-of-charge reference values may be identical to each other in the same charging cycle range; as the charging cycle range changes, the electronic device may change the plurality of state-of-charge reference values. For example, the specified number of times may be 300 times, but the disclosure is not limited thereto. For example, the interval of the number of times may be differently set for each charging cycle range (e.g., an interval of 300 times in the case of the first range and an interval of 100 times in the case of the second range).

As the charging times elapses, the state of charge of the battery may increase; as an increasing speed of the state of charge of the battery becomes slower, a time (i.e., T2 and T4 of FIG. 4A) when the state of charge of the battery is greater than or equal to the state-of-charge reference value may be delayed.

However, the electronic device according to the above embodiment may set the state-of-charge reference value to be smaller as the charging cycle of the battery increases; through the adjustment of the electronic device, the time (i.e., T2 and T4 of FIG. 4A) when the state of charge of the battery is greater than or equal to the state-of-charge reference value may not be delayed. This effect will be described in detail with reference to FIG. 6.

According to one or more embodiments, the electronic device may further include a communication circuitry operatively connected with at least one processor, may receive a plurality of state-of-charge reference values, which are set depending on the charging cycle of the battery, from an external device (e.g., the electronic device 102, the electronic device 104, or the server 108 of FIG. 1) through the communication circuitry, and may store the plurality of state-of-charge reference values thus received in the memory.

According to one or more embodiments, the electronic device may change one of the plurality of state-of-charge reference values stored in the memory.

According to an embodiment, even in the same charging cycle of the battery of the electronic device, the degree of degradation of the battery of the electronic device may be variable. For example, in the case where a time period where the electronic device has the corresponding charging cycle is a first time period, the degree of degradation of the battery may become worse compared to the case where a time period where the electronic device has the corresponding charging cycle is a second time period longer than the first time period. Alternatively, in the case where the user of the electronic device mainly uses an application whose batter consumption is great, the degree of degradation of the battery may become worse compared to the case where the user of the electronic device mainly uses an application whose battery consumption is relatively small.

According to an embodiment, when a time period necessary for the charging cycle of the battery to reach a given cycle is within a given time period range (e.g., within the first time period shorter than the second time period), the processor of the electronic device may decrease the plurality of state-of-charge reference values that are stored in the memory after being set depending on the charging cycle.

According to an embodiment, when a use time of applications whose type is determined as the consumption of the battery is great is greater than or equal to a given time, the processor of the electronic device may decrease the plurality of state-of-charge reference values that are stored in the memory after being set depending on the charging cycle.

According to an embodiment, the processor of the electronic device may decrease the plurality of state-of-charge reference values based on an available expected time of the battery. For example, the processor may monitor the electronic device use pattern (e.g., a use time, a used application, or a charging pattern) of the user and/or the available expected time of the battery that is completely charged, and may determine the degree of degradation based on the change in the available expected time of the battery.

According to an embodiment, when the available expected time of the battery is decreased as much as a specified time or more, the processor of the electronic device may decrease the plurality of state-of-charge reference values that are stored in the memory after being set depending on the charging cycle.

According to the above embodiments, the electronic device may adjust the plurality of state-of-charge reference values based on the battery use state of the electronic device (or the user of the electronic device); in this case, because the electronic device charges the battery in a state of considering the degree of degradation of the battery more accurately for each device, the charging efficiency of the degraded battery may be maximized.

According to one or more embodiments, the electronic device may differently set the plurality of state-of-charge reference values depending on the charging cycle and may also differently set the reference values (e.g., the first voltage, the second voltage, and the third voltage of FIG. 4B) for the voltage of the battery and the reference values (e.g., the first current, the second current, and the third current of FIG. 4B) depending on the charging cycle. For example, as the charging cycle increases (e.g., referring to FIG. 4B, as the charging cycle transitions from the first range to the second range), the electronic device may decrease the first voltage, the second voltage, the third voltage, the first current, the second current, and the third current.

Figure 6:
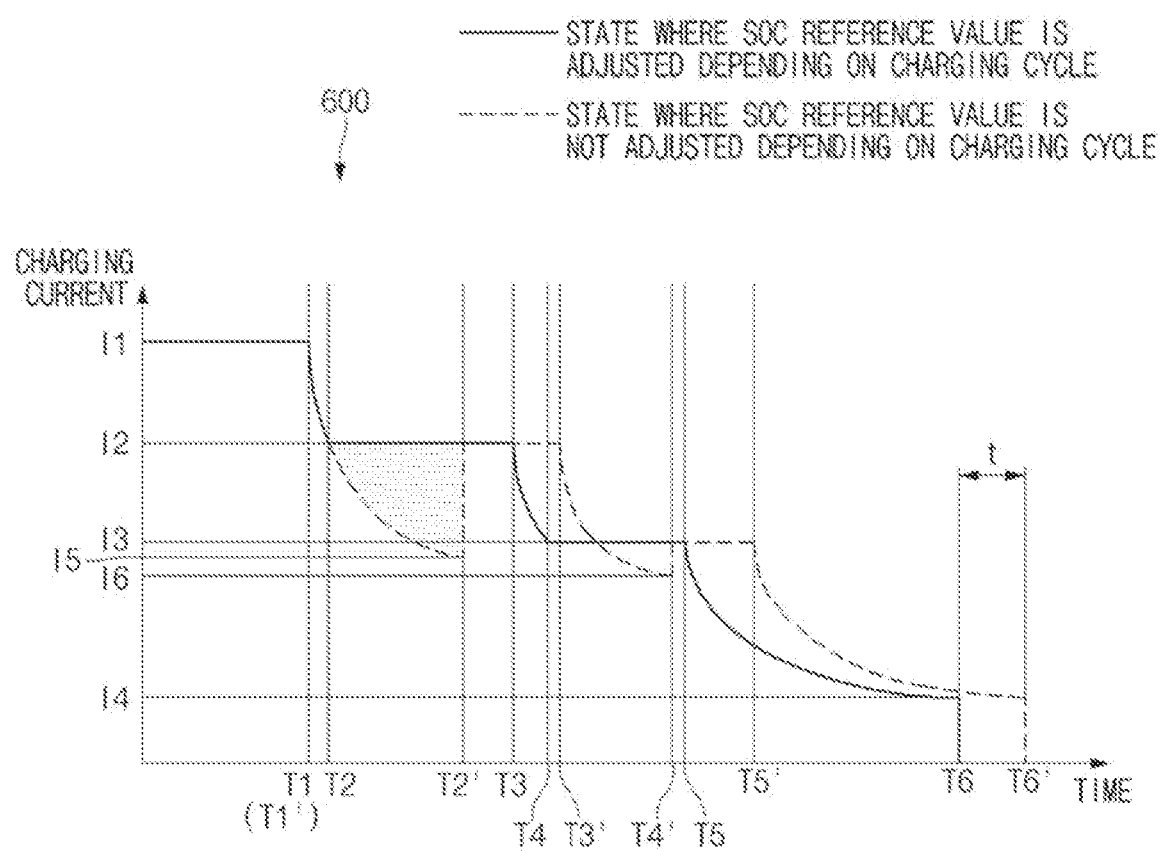
FIG. 6 is a graph illustrating an effect of a battery charging method of an electronic device according to an embodiment.

FIG. 6 is a graph 600 illustrating an effect of a battery charging method of an electronic device (e.g., the electronic device 101 of FIG. 3) according to an embodiment. Operations to be described below, which the electronic device performs to charge the battery, may be performed by a processor (e.g., the processor 120 of FIG. 3) of the electronic device.

It is assumed that the electronic device according to the embodiment is in a state where the charging cycle of the battery is greater than or equal to a given value and an increasing speed of the charging cycle of the battery is reduced due to the degradation of the battery when the battery is charged.

A solid line shows the process where the electronic device according to the embodiment charges the battery in a state of setting a condition for changing from the constant voltage section to the constant current section being a next section based on state-of-charge reference values corresponding to a current charging cycle, and a dashed line shows the process where an electronic device according to a comparative embodiment charges the battery in a state of setting a condition for changing from the constant voltage section to the constant current section being a next section based on state-of-charge reference values corresponding to an initial charging cycle. In other words, the solid line shows the process where the electronic device according to one or more embodiments charges the battery in a state where a state-of-charge reference value is adjusted depending on the charging cycle, and the dashed line shows the process where the electronic device according to the comparative embodiment charges the battery in a state where a state-of-charge reference value is not adjusted depending on the charging cycle.

For example, the charging cycle of the electronic device may belong to the second range of FIG. 5; a graph shown by the solid line may show the process where the electronic device charges the battery in a state of setting a condition for changing from the constant voltage section to the constant current section being a next section based on the third state-of-charge reference value smaller than the first state-of-charge reference value and the fourth state-of-charge reference value smaller than the second state-of-charge reference value; a graph shown by the dashed line may show the process where the electronic device according to the comparative embodiment charges the battery in a state of setting a condition for changing from the constant voltage section to the constant current section being a next section based on the first state-of-charge reference value and the second state-of-charge reference value.

According to an embodiment, a section where the charging current is maintained uniformly refers to the constant current section, and a section where the charging current gradually decreases refers to the constant voltage section.

According to an embodiment, as the electronic device adjusts a state-of-charge reference value depending on the charging cycle, at least one time when the change from the constant current section to the constant voltage section is made or the change from the constant voltage section to the constant current section is made may be variable. Below, in the embodiment of FIG. 6, a time corresponding to the solid line showing a state where the electronic device according to an embodiment adjusts a state-of-charge reference value depending on the charging cycle may be referred to as an "adjusted time", and a time corresponding to the dashed line showing a state where the electronic device according to the comparative embodiment does not adjust a state-of-charge reference value depending on the charging cycle may be referred to as a "time"

Referring to the graph shown by the dashed line, the electronic device according to the comparative embodiment may have the first constant current section in which the voltage of the battery increases while maintaining the charging current at the first current I1. The electronic device according to the comparative embodiment may have the first constant voltage section in which the charging current gradually decreases from the first current I1 while the voltage of the battery is uniformly maintained at the first time T1' when the increasing voltage of the battery reaches the target voltage of the first step. The electronic device according to the comparative embodiment may gradually decrease the charging current while uniformly maintaining the voltage of the battery at the target voltage of the first step until the second time T2' when the state of charge of the battery is greater than or equal to the first state-of-charge reference value. In this case, the charging current may decrease from the first current I1 to a fifth current I5. The electronic device according to the comparative embodiment may have the second constant current section in which the voltage of the battery increases while uniformly maintaining the charging current at the second current I2 from the second time T2'. The electronic device according to the comparative embodiment may have the second constant voltage section in which the charging current gradually decreases from the second current I2 while the voltage of the battery is uniformly maintained at the third time T3' when the increasing voltage of the battery reaches the target voltage of the second step. The electronic device according to the comparative embodiment may gradually decrease the charging current while uniformly maintaining the voltage of the battery at the target voltage of the second step until the fourth time T4' when the state of charge of the battery is greater than or equal to the second state-of-charge reference value. In this case, the charging current may decrease from the second current I2 to a sixth current I6. The electronic device according to the comparative embodiment may have the third constant current section in which the voltage of the battery increases while uniformly maintaining the charging current at the third current I3 from the fourth time T4'. The electronic device according to the comparative embodiment may have the third constant voltage section in which the charging current gradually decreases from the third current I3 while the voltage of the battery is uniformly maintained at the fifth time T5' when the increasing voltage of the battery reaches the target voltage of the third step. The electronic device according to the comparative embodiment may gradually decrease the charging current while uniformly maintaining the voltage of the battery at the target voltage of the third step until the sixth time T6' when the charging current reaches the end-of-charge current I4. The electronic device according to the comparative embodiment may stop the charging of the battery by blocking the charging current flowing to the battery at the sixth time T6' when the charging current of the battery reaches the end-of-charge current I4. At the sixth time T6', the battery may be in a state of being fully charged.

Referring to the graph shown by the solid line, the electronic device according to an embodiment may have the first constant current section in which the voltage of the battery increases while maintaining the charging current at the first current I1. The electronic device according to an embodiment may have the first constant voltage section in which the charging current gradually decreases from the first current I1 while the voltage of the battery is uniformly maintained at the first adjusted time T1 when the increasing voltage of the battery reaches the target voltage of the first step. The electronic device according to an embodiment may gradually decrease the charging current while uniformly maintaining the voltage of the battery at the target voltage of the first step until the second adjusted time T2 when the state of charge of the battery is greater than or equal to the first state-of-charge reference value. In this case, the charging current may decrease from the first current I1 to the second current I2. The electronic device according to an embodiment may have the second constant current section in which the voltage of the battery increases while uniformly maintaining the charging current at the second current I2 from the second adjusted time T2. The electronic device according to an embodiment may have the second constant voltage section in which the charging current gradually decreases from the second current I2 while the voltage of the battery is uniformly maintained at the third adjusted time T3 when the increasing voltage of the battery reaches the target voltage of the second step. The electronic device according to an embodiment may gradually decrease the charging current while uniformly maintaining the voltage of the battery at the target voltage of the second step until the fourth adjusted time T4 when the state of charge of the battery is greater than or equal to the second state-of-charge reference value. In this case, the charging current may decrease from the second current I2 to the third current I3. The electronic device according to an embodiment may have the third constant current section in which the voltage of the battery increases while uniformly maintaining the charging current at the third current I3 from the fourth adjusted time T4. The electronic device according to an embodiment may have the third constant voltage section in which the charging current gradually decreases from the third current I3 while the voltage of the battery is uniformly maintained at the fifth adjusted time T5 when the increasing voltage of the battery reaches the target voltage of the third step. The electronic device according to an embodiment may gradually decrease the charging current while uniformly maintaining the voltage of the battery until the sixth adjusted time T6 when the charging current reaches the end-of-charge current I4. The electronic device according to an embodiment may stop the charging of the battery by blocking the charging current flowing to the battery at the sixth adjusted time T6 when the charging current reaches the end-of-charge current I4. At the sixth adjusted time T6, the battery may be in a state of being fully charged.

The electronic device according to an embodiment may prevent the delay of the time when the change from the constant voltage section to the constant current section being a next section is made, by setting a condition for the constant voltage section to the constant current section being a next section based on the plurality of state-of-charge reference values to decrease as the charging cycle increases; as such, a charging time necessary to fully charge the battery may be decreased as much as "t".

According to an embodiment, in the graph in which a horizontal axis represents a charging time of a battery and a vertical axis represents a charging current of a battery, an integral value may mean a charging amount of the battery. Referring to the second time T2' being the same time, the integral value of the graph shown by the solid line may be greater than the integral value of the graph shown by the dashed line. During the same time, the electronic device according to an embodiment corresponding to the graph shown by the solid line may charge the battery more than the electronic device according to the comparative embodiment corresponding to the graph shown by the dashed line.

As the electronic device according to an embodiment sets the condition for changing from the constant voltage section to the constant current section being a next section based on the plurality of state-of-charge reference values to decrease as the charging cycle increases, even in the case of the battery whose charging cycle is greater than or equal to the given value, that is, even though the battery is degraded, the amount of charging that is made with respect to the battery during the same time may increase, and the battery charging efficiency may be improved.

As the charging cycle increases, the electronic device according to an embodiment may differently set a state-of-charge reference value included in a condition for changing from the constant voltage section to the constant current section being a next section; in this case, even though the battery is degraded, the charging efficiency may be maintained to be substantially identical to that before the battery is degraded.

Figure 7A:
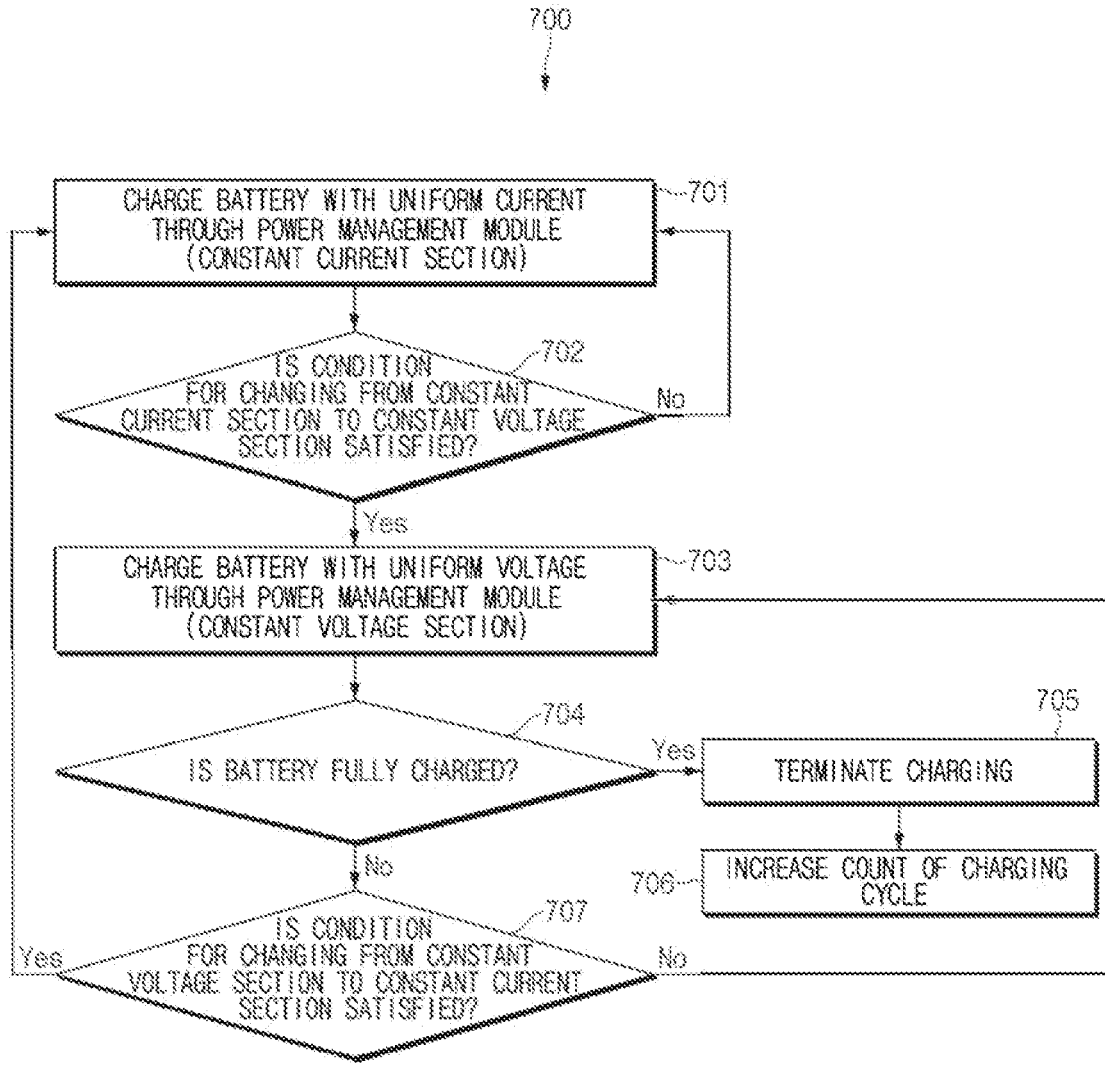
FIG. 7A is a flowchart illustrating a method in which an electronic device according to an embodiment charges a battery.

FIG. 7A is a flowchart 700 illustrating a method in which an electronic device (e.g., the electronic device 101 of FIG. 3) according to an embodiment charges a battery (e.g., the battery 189 of FIG. 3). Operations to be described below, which the electronic device performs to charge the battery, may be performed by a processor (e.g., the processor 120 of FIG. 3) of the electronic device.

In FIG. 7A, the electronic device according to an embodiment may start the charging when the electronic device is connected with the external power source, may charge the battery by using a constant current (CC) being a current flowing to the battery based on the power received from the external power source (e.g., a power adapter or a USB or wireless charger), and may charge the battery by using a constant voltage (CV) when the voltage of the battery reaches a specified voltage (e.g., a target voltage).

In operation 701, the electronic device may operate in the constant current section by charging the battery with a uniform current through a power management module (e.g., the power management module 188 of FIG. 3). Through the power management module, the electronic device may gradually increase the voltage of the battery while uniformly maintaining the current flowing to the battery.

In operation 702, the electronic device may determine whether there is satisfied a condition for changing from the constant current section to the constant voltage section, at a specified time interval (or in real time) during the constant current section. For example, when the voltage of the battery reaches a specified voltage (e.g., a target voltage) (e.g., the first voltage, the second voltage, or the third voltage of FIG. 4B), the electronic device may determine that there is satisfied the condition for changing from the constant current section to the constant voltage section ("Yes"). When there is satisfied the condition for changing from the constant current section to the constant voltage section ("Yes"), the electronic device may perform operation 703. When it is determined in operation 702 that there is not satisfied the condition for changing from the constant current section to the constant voltage section ("No"), the electronic device may again perform operation 701 to determine whether there is satisfied the condition for changing from the constant current section to the constant voltage section, at the specified time interval (or in real time) during the constant current section.

In operation 703, the electronic device may operate in the constant voltage section by charging the battery with a uniform voltage through the power management module. Through the power management module, the electronic device may gradually decrease a current (i.e., a charging current) flowing to the battery while maintaining the voltage of the battery uniformly.

In operation 704, the electronic device may determine whether the battery is fully charged, at a specified time interval (or in real time) during the constant voltage section. For example, when the current (i.e., the charging current) flowing to the battery reaches the end-of-charge current, the electronic device may determine that the battery is fully charged ("Yes"). As it is determined that the battery is fully charged, the electronic device may terminate (stop) the charging of the battery (operation 705) and may increase a count of the charging cycle of the battery (operation 706).

In operation 705, the electronic device may terminate (or stop) the charging by blocking the current flowing to the battery.

For example, in operation 706, the electronic device may increase the charging cycle from n times to (n+1) times.

In operation 704, when the current (i.e., the charging current) flowing to the battery does not reach the end-of-charge current (e.g., when the magnitude of the charging current of the battery is greater than the magnitude of the end-of-charge current), the electronic device may determine that the battery is not fully charged ("No"). As the electronic device determines the battery is not fully charged, in operation 707, the electronic device may determine whether there is satisfied the condition for changing from the constant voltage section to the constant current section. The electronic device may determine whether there is satisfied the condition for changing from the constant voltage section to the constant current section, at the specified time interval (or in real time) during the constant voltage section.

In operation 707, the electronic device whether there is satisfied the condition for changing from the constant voltage section to the constant current section, by determining whether there is satisfied a condition including state-of-charge reference values based on the charging cycle. For example, when the state of charge of the battery is greater than or equal to a plurality of state-of-charge reference values based on the charging cycle, the electronic device may transition from the constant voltage section to the constant current section, but the disclosure is not limited thereto. For example, the operation (i.e., operation 707) of determining whether there is satisfied the condition for changing from the constant voltage section to the constant current section will be described in detail with reference to FIG. 7B.

When it is determined in operation 707 that there is satisfied the condition for changing from the constant voltage section to the constant current section ("Yes"), the electronic device may perform operation 701. As the electronic device determines that there is satisfied the condition for changing from the constant voltage section to the constant current section, the electronic device may operate in the constant current section by charging the battery with a uniform current through the power management module. When it is determined in operation 707 that there is not satisfied the condition for changing from the constant voltage section to the constant current section ("No"), the electronic device may perform operation 703. For example, the electronic device may perform the operation (i.e., operation 704) of determining whether the battery is fully charged, at the specified time interval (or in real time) during the constant voltage section.

According to the above embodiment, the electronic device may charge the battery while alternately having the plurality of constant current sections and the plurality of constant voltage sections. For example, when the battery is charged, the electronic device may have the first constant current section, the first constant voltage section, the second constant current section, the second constant voltage section, the third constant current section, and the third constant voltage section in order. For example, the electronic device may charge the battery depending on three steps by performing operation 701 (first constant current section), operation 702, operation 703 (first constant voltage section), operation 704, operation 707, operation 701 (second constant current section), operation 702, operation 703 (second constant voltage section), operation 704, operation 707, operation 701 (third constant current section), operation 702, operation 703 (third constant voltage section), operation 704, and operation 705 in order, but the present disclosure is not limited thereto. For example, the battery may be charged depending on two steps or four steps. Below, it is assumed that the electronic device charges the battery depending on three steps.

According to an embodiment, through the power management module, the electronic device may charge the battery depending on a plurality of steps. For example, the electronic device may charge the battery depending on three steps. Through the power management module, the electronic device may charge the battery while maintaining the charging current of the battery at a first current magnitude corresponding to the first step (operation 701). A section where the electronic device maintains the charging current of the battery at the first current magnitude may be referred to as a "first constant current section". Through the power management module, the electronic device may charge the battery while maintaining the voltage of the battery at a first voltage magnitude corresponding to the first step (operation 703). A section where the electronic device maintains the voltage of the battery at the first voltage magnitude may be referred to as a "first constant voltage section". Through the power management module, the electronic device may charge the battery while maintaining the charging current of the battery at a second current magnitude corresponding to the second step (operation 701). In this case, the second current magnitude may be smaller than the first current magnitude. A section where the electronic device maintains the charging current of the battery at the second current magnitude may be referred to as a "second constant current section". Through the power management module, the electronic device may charge the battery while maintaining the voltage of the battery at a second voltage magnitude corresponding to the second step (operation 703). In this case, the second voltage magnitude may be greater than the first voltage magnitude. A section where the electronic device maintains the voltage of the battery at the second voltage magnitude may be referred to as a "second constant voltage section". Through the power management module, the electronic device may charge the battery while maintaining the charging current of the battery at a third current magnitude corresponding to the third step (operation 701). In this case, the third current magnitude may be smaller than the second current magnitude. A section where the electronic device maintains the charging current of the battery at the third current magnitude may be referred to as a "third constant current section". Through the power management module, the electronic device may charge the battery while maintaining the voltage of the battery at a third voltage magnitude corresponding to the third step (operation 703). A section where the electronic device maintains the voltage of the battery at the third voltage magnitude may be referred to as a "third constant voltage section". In this case, the third voltage magnitude may be greater than the second voltage magnitude.

According to an embodiment, the battery voltage of the electronic device may decrease while the electronic device is charging the battery through the external power source. For example, a display (e.g., the display module 160 of FIG. 1) of the electronic device may include a foldable or rollable display; when the display is unfolded, a current that is consumed by the electronic device may be greater than the charging current of the battery through the external power source. In an embodiment, when the current consumed by the electronic device is greater than the charging current of the battery in the first constant voltage section, the second constant current section, the second constant voltage section, the third constant current section, or the third constant voltage section, the electronic device may transition to the first constant current section.

According to an embodiment, the electronic device may charge the battery while maintaining the charging current of the battery at the first current through the power management module during the first constant current section, may charge the battery while maintaining the charging current of the battery at the second current smaller in magnitude than the first current through the power management module during the second constant current section, and may charge the battery while maintaining the charging current of the battery at the third current smaller in magnitude than the second current through the power management module during the third constant current section.

According to an embodiment, the electronic device may charge the battery while maintaining the voltage of the battery at the first voltage during the first constant voltage section, may charge the battery while maintaining the voltage of the battery at the second voltage greater in magnitude than the first voltage during the second constant voltage section, and may charge the battery while maintaining the voltage of the battery at the third voltage greater in magnitude than the second voltage during the third constant voltage section.

According to an embodiment, as the electronic device decreases the charging current stepwise by alternately repeating the constant current section and the constant voltage section, the electronic device may secure the stability of the battery charging operation.

According to an embodiment, that the electronic device transitions from the constant voltage section to the constant current section may mean that the charging step of the electronic device increases (e.g., from the first step to the second step or from the second step to the third step). For example, the condition that the electronic device transitions from the constant voltage section to the constant current section may mean the condition for changing from the constant voltage section of a previous step (e.g., an N-th step) to the constant current section of a next step (e.g., an (N+1)-th step).

Figure 7B:
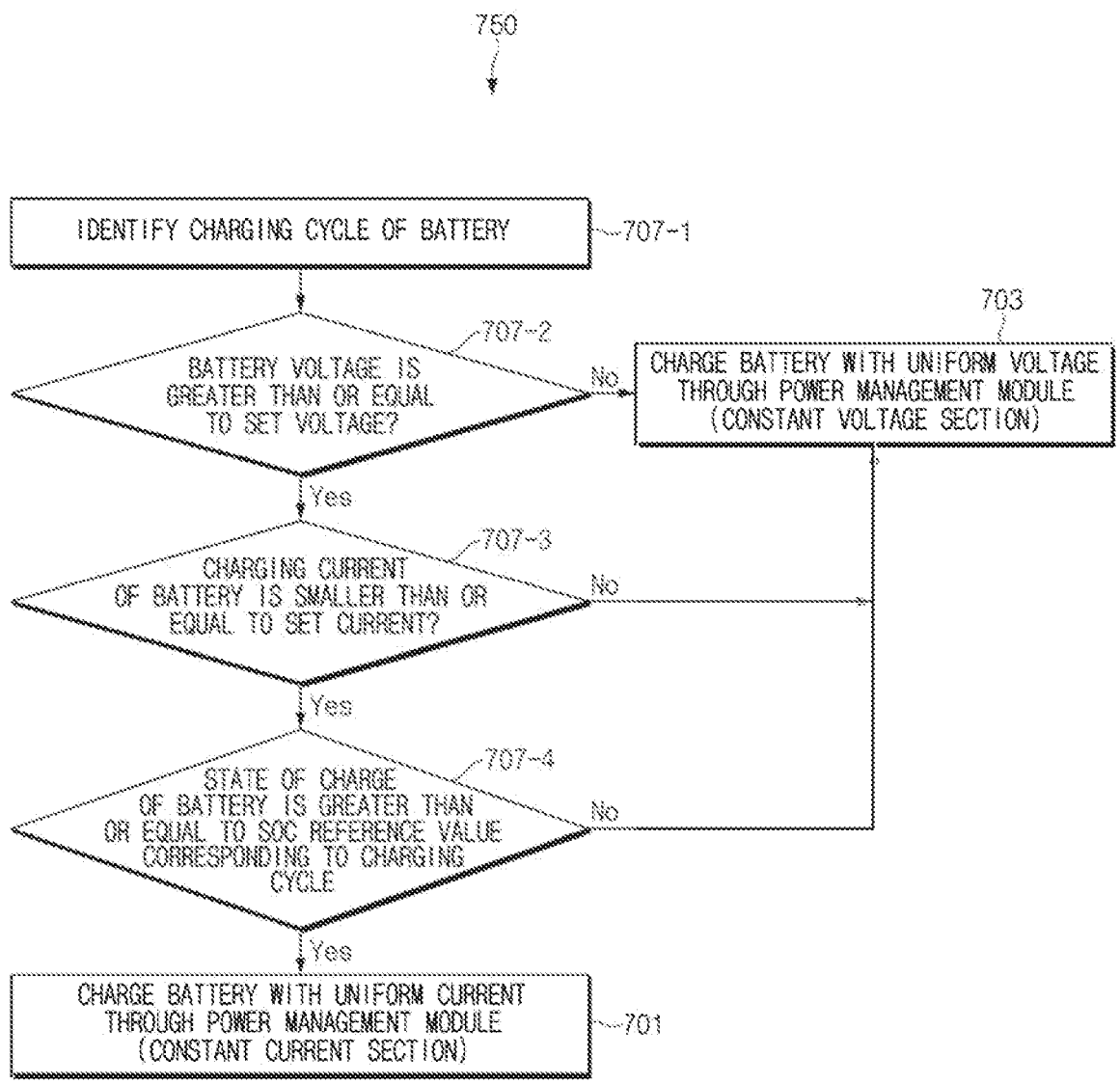
FIG. 7B is a flowchart illustrating a process in which an electronic device according to an embodiment transitions from a constant voltage section of a previous step to a constant current section of a next step.

FIG. 7B is a flowchart 750 illustrating a process in which an electronic device (e.g., the electronic device 101 of FIG. 3) according to an embodiment transitions from a constant voltage section of a previous step (e.g., an N-th step) to a constant current section of a next step (e.g., an (N+1)-th step). The electronic device according to an embodiment may perform operation 707 of FIG. 7A by performing operation 707-1 to operation 707-4 of FIG. 7B. Operations of the electronic device to be described below may be performed by a processor (e.g., the processor 120 of FIG. 3) of the electronic device.

In operation 707-1, the electronic device may identify the charging cycle of the battery. The charging cycle may mean the number of times of charging/discharging obtained from the power management module of the electronic device. For example, when the power is received from the external power source (e.g., a power adapter or a USB or wireless charger), the electronic device may identify the charging cycle of the battery and may charge the battery through the power management module. For example, before starting operation 701 of FIG. 7A after the connection with the external power source, the electronic device may perform operation 707-1.

According to an embodiment, based on the identified charging cycle, the electronic device may in advance set the following before starting the charging of the battery: the voltage of the battery, the charging current of the battery, and the state-of-charge reference value of the battery targeted for a condition for changing the constant voltage section of a previous step (e.g., an N-th step) to the constant current section of a next step (e.g., an (N+1)-th step).

According to an embodiment, as the charging cycle identified in operation 707-1 increases, the electronic device may decrease the set voltage, the set current, and the state-of-charge reference value corresponding the charging cycle that the electronic device uses as the condition for changing from the constant voltage section of the previous step (e.g., an N-th step) to the constant current section of the next step (e.g., an (N+1)-th step).

According to an embodiment, the electronic device may set the condition for changing from the constant voltage section of the previous step (e.g., an N-th step) to the constant current section of the next step (e.g., an (N+1)-th step) based on state-of-charge reference values set to decrease as the charging cycle of the battery increases.

According to an embodiment, the electronic device may set that the state of charge of the battery is greater than or equal to the first state-of-charge reference value, as the condition for changing from the first constant voltage section to the second constant current section; the electronic device may set that the state of charge of the battery is greater than or equal to the second state-of-charge reference value, as the condition for changing from the second constant voltage section to the third constant current section. In a second cycle greater than the first cycle, the electronic device may set that the state of charge of the battery is greater than or equal to the third state-of-charge reference value smaller than the first state-of-charge reference value, as the condition for changing from the first constant voltage section to the second constant current section and may set that the state of charge of the battery is greater than or equal to the fourth state-of-charge reference value smaller than the second state-of-charge reference value, as the condition for changing from the second constant voltage section to the third constant current section.

According to an embodiment, the electronic device may set the condition for changing from the constant voltage section of the previous step (e.g., an N-th step) to the constant current section of the next step (e.g., an (N+1)-th step) further based on voltages and currents set to decrease as the charging cycle of the battery increases.

For example, in the first cycle, the electronic device may set that the voltage of the battery is greater than or equal to the first set voltage, the charging current of the battery is smaller than or equal to the first set current, and the state of charge of the battery is greater than or equal to the first state-of-charge reference value, as a condition for changing from the first constant voltage section to the second constant current section and may set that the voltage of the battery is greater than or equal to the second set voltage, the charging current of the battery is smaller than or equal to the second set current, and the state of charge of the battery is greater than or equal to the second state-of-charge reference value, as a condition for changing from the second constant voltage section to the third constant current section.

In the second cycle greater than the first cycle, the electronic device may set that the voltage of the battery is greater than or equal to the third set voltage smaller in magnitude than the first set voltage, the charging current of the battery is smaller than or equal to the third set current smaller in magnitude than the first set current, and the state of charge of the battery is greater than or equal to the third state-of-charge reference value, as a condition for changing from the first constant voltage section to the second constant current section and may set that the voltage of the battery is greater than or equal to the fourth set voltage smaller in magnitude than the second set voltage, the charging current of the battery is smaller than or equal to the fourth set current smaller in magnitude than the second set current, and the state of charge of the battery is greater than or equal to the fourth state-of-charge reference value, as a condition for changing from the second constant voltage section to the third constant current section.

In operation 707-2, the electronic device may check (or determine) whether the voltage of the battery is greater than or equal to the set voltage. For example, the set voltage may refer to a voltage that the electronic device sets to correspond to the charging cycle of the battery identified in operation 707-1. For example, when it is determined in operation 707-1 that the charging cycle of the battery corresponds to the first cycle, in operation 707-2, the electronic device may determine whether the voltage of the battery is greater than or equal to the first set voltage or the second set voltage; when it is determined in operation 707-1 that the charging cycle of the battery corresponds to the second cycle, in operation 707-2, the electronic device may determine whether the voltage of the battery is greater than or equal to the third set voltage or the fourth set voltage. When the voltage of the battery is greater than or equal to the voltage set to correspond to the charging cycle of the battery ("Yes"), the electronic device may perform operation 707-3. When the voltage of the battery is smaller than the voltage set to correspond to the charging cycle of the battery ("No"), the electronic device may perform operation 703.

In operation 707-3, the electronic device may check (or determine) whether the charging current of the battery is smaller than or equal to the set current. For example, the set current may refer to a current that the electronic device sets to correspond to the charging cycle of the battery identified in operation 707-1. For example, when it is determined in operation 707-1 that the charging cycle of the battery corresponds to the first cycle, in operation 707-2, the electronic device may determine whether the charging current of the battery is smaller than or equal to the first set current or the second set current; when it is determined in operation 707-1 that the charging cycle of the battery corresponds to the second cycle, in operation 707-2, the electronic device may determine whether the charging current of the battery is smaller than or equal to the third set current or the fourth set current. When the charging current of the battery is smaller than or equal to the current set to correspond to the charging cycle of the battery ("Yes"), the electronic device may perform operation 707-4. When the charging current of the battery exceed the current set to correspond to the charging cycle of the battery ("No"), the electronic device may perform operation 703.

In operation 707-4, the electronic device may check (or determine) whether the state of charge of the battery is greater than or equal to the state-of-charge reference value corresponding to the charging cycle. For example, before operation 707-4, the electronic device may in advance set the state-of-charge reference value corresponding to the charging cycle identified in operation 707-1; when operation 707-4 is performed, the electronic device may determine whether the state of charge of the battery is greater than or equal to the state-of-charge reference value set in advance. For example, when it is determined in operation 707-1 that the charging cycle of the battery corresponds to the first cycle, in operation 707-4, the electronic device may determine whether the state of charge of the battery is greater than or equal to the first state-of-charge reference value; when it is determined in operation 707-1 that the charging cycle of the battery corresponds to the second cycle, in operation 707-4, the electronic device may determine whether the state of charge of the battery is greater than or equal to the third state-of-charge reference value or the fourth state-of-charge reference value. When the state of charge of the battery is greater than or equal to the state-of-charge reference value corresponding to the charging cycle of the battery ("Yes"), the electronic device may perform operation 701.

For example, as the electronic device determines that the state of charge of the battery in the constant voltage section is greater than or equal to the state-of-charge reference value corresponding to the charging cycle, the electronic device may transition to the constant current section in which the battery is charged with a uniform current through the power management module. When the state of charge of the battery is smaller than the state-of-charge reference value corresponding to the charging cycle of the battery ("No"), the electronic device may perform operation 703.

According to the above embodiment, when the voltage of the battery is greater than or equal to the voltage set to correspond to the charging cycle, the charging current of the battery is smaller than or equal to the current set to correspond to the charging cycle, and the state of charge of the battery is greater than or equal to the state-of-charge reference value corresponding to the identified charging cycle of the battery, the electronic device may transition from the constant voltage section of the previous step (e.g., an N-th step) to the constant current section of the next step (e.g., an (N+1)-th step).

According to an embodiment, when the voltage of the battery is greater than or equal to the first set voltage, the charging current of the battery is smaller than or equal to the first set current, and the state of charge of the battery is greater than or equal to the first state-of-charge reference value, the electronic device may transition from the constant voltage section (e.g., the first constant voltage section) of the first step to the constant current section (e.g., the second constant current section) of the second step; when the voltage of the battery is greater than or equal to the second set voltage, the charging current of the battery is smaller than or equal to the second set current, and the state of charge of the battery is greater than or equal to the second state-of-charge reference value, the electronic device may transition from the constant voltage section (e.g., the second constant voltage section) of the second step to the constant current section (e.g., the third constant current section) of the third step.

According to an embodiment, the electronic device may differently set the following depending on the charging step: the voltage of the battery, the charging current of the battery, and the state-of-charge reference value of the battery targeted for a condition for changing from the constant voltage section of the previous step (e.g., an N-th step) to the constant current section of the next step (e.g., an (N+1)-th step). For example, as the charging step increases, under control of the electronic device, the voltage may increase, the charging current may decrease, and the state-of-charge reference value may increase. In the above embodiment, the second set voltage may be greater in magnitude than the first set voltage, the second set current may be smaller in magnitude than the first set current, and the second state-of-charge reference value may be greater in magnitude than the first state-of-charge reference value.

According to an embodiment, the operation in which the electronic device transitions from the first constant voltage section to the second constant current section may mean an operation of switching the charging manner from a charging manner in which the charging current of the battery gradually decreases while the voltage of the battery is uniformly maintained at the first voltage corresponding to the first step through the power management module, to a charging manner in which the voltage of the battery gradually increases while the charging current of the battery is uniformly maintained at the second current corresponding to the second step through the power management module.

According to an embodiment, the operation in which the electronic device transitions from the second constant voltage section to the third constant current section may mean an operation of switching the charging manner from a charging manner in which the charging current of the battery gradually decreases while the voltage of the battery is uniformly maintained at the second voltage magnitude corresponding to the second step through the power management module, to a charging manner in which the voltage of the battery gradually increases while the charging current of the battery is uniformly maintained at the third current magnitude corresponding to the third step through the power management module.

According to an embodiment, the operation in which the electronic device transitions from the first constant voltage section to the second constant current section may correspond to the operation in which the electronic device switches the charging step from the first step to the second step, and the operation in which the electronic device transitions from the second constant voltage section to the third constant current section may correspond to the operation in which the electronic device switches the charging step from the second step to the third step.

For example, after the operation (i.e., the first constant voltage section) in which the battery is charged while maintaining the voltage of the battery at the first voltage magnitude, when the voltage of the battery is greater than or equal to the first set voltage, the charging current of the battery is smaller than or equal to the first set current, and the state of charge of the battery is greater than or equal to the first state-of-charge reference value, the electronic device may perform the operation of switching the charging step of the battery from the first step to the second step by performing the operation (i.e., the second constant current section) in which the battery is charged while maintaining the charging current of the battery at the second current magnitude. After the operation (i.e., the second constant voltage section) in which the battery is charged while maintaining the voltage of the battery at the second voltage magnitude, when the voltage of the battery is greater than or equal to the second set voltage, the charging current of the battery is smaller than or equal to the second set current, and the state of charge of the battery is greater than or equal to the second state-of-charge reference value, the electronic device may perform the operation of switching the charging step of the battery from the second step to the third step by performing the operation (i.e., the third constant current section) in which the battery is charged while maintaining the charging current of the battery at the third current magnitude.

According to an embodiment of the disclosure, an electronic device (e.g., the electronic device 101 of FIG. 1 or the electronic device 101 of FIG. 3) may include a battery (e.g., the battery 189 of FIG. 1, the battery 189 of FIG. 2, or the battery 189 of FIG. 3), a power management module (e.g., the power management module 188 of FIG. 1, the power management module 188 of FIG. 2), or the power management module 188 of FIG. 3) that controls the battery, at least one processor (e.g., the processor 120 of FIG. 1 or the processor 120 of FIG. 3) that is operatively connected to the battery and the power management module, and a memory (e.g., the memory 130 of FIG. 1 or the memory 130 of FIG. 3) that is operatively connected with the at least one processor.

The memory may store a plurality of state-of-charge reference values depending on a charging cycle of the battery, and the memory may store one or more instructions that, when executed, cause the at least one processor to charge the battery through the power management module such that a charging section of the battery alternately includes a plurality of constant current sections, in which charging is made with a uniform current, and a plurality of constant voltage sections, in which charging is made with a uniform voltage, to identify a charging cycle of the battery, and to set a condition for changing from one constant voltage section among the plurality of constant voltage sections to a constant current section following the one constant voltage section from among the plurality of constant current sections, based on a state-of-charge reference value corresponding to the identified charging cycle of the battery from among the state-of-charge reference values stored in the memory.

According to an embodiment of the disclosure, the plurality of state-of-charge reference values may include a first state-of-charge reference value and a second state-of-charge reference value, and the instructions may cause the processor to identify a state of charge of the battery, to set that the identified state of charge of the battery is greater than or equal to the first state-of-charge reference value, as a condition for changing from a first constant voltage section to a second constant current section following the first constant voltage section, and to set that the identified state of charge of the battery is greater than or equal to the second state-of-charge reference value, as a condition for changing from a second constant voltage section to a third constant current section following the second constant voltage section. According to an embodiment of the disclosure, as the charging cycle of the battery increases, the plurality of state-of-charge reference values stored in the memory may decrease.

According to an embodiment of the disclosure, the charging cycle of the battery may include a first cycle and a second cycle greater than the first cycle, and the instructions may cause the processor to perform the following operations in the first cycle: setting that the identified state of charge of the battery is greater than or equal to the first state-of-charge reference value, as the condition for changing from the first constant voltage section to the second constant current section and setting that the identified state of charge of the battery is greater than or equal to the second state-of-charge reference value, as the condition for changing from the second constant voltage section to the third constant current section and to perform the following operations in the second cycle: setting that the identified state of charge of the battery is greater than or equal to a third state-of-charge reference value smaller than the first state-of-charge reference value, as the condition for changing from the first constant voltage section to the second constant current section and setting that the identified state of charge of the battery is greater than or equal to a fourth state-of-charge reference value smaller than the second state-of-charge reference value, as the condition for changing from the second constant voltage section to the third constant current section.

According to an embodiment of the disclosure, the instructions may cause the processor to further set a voltage of the battery and a charging current of the battery, as a condition for changing from a first constant voltage section to a second constant current section following the first constant voltage section.

According to an embodiment of the disclosure, the condition for changing from the first constant voltage section to the second constant current section may be that the voltage of the battery is greater than or equal to a set voltage, the charging current of the battery is smaller than or equal to a set current, and the state of charge of the battery is greater than or equal to a set state-of-charge reference value.

According to an embodiment of the disclosure, the instructions may cause the processor to set a target voltage of the battery, as a condition for changing from a first constant current section to a first constant voltage section following the first current voltage section, and the condition for changing from the first constant current section to the first constant voltage section may be that a voltage of the battery reaches the target voltage.

According to an embodiment of the disclosure, the instructions may cause the processor to charge the battery through the power management module depending on a plurality of steps, in which a constant current section of a first step is adjacent to a constant voltage section of the first step and wherein the constant voltage section of the first step is adjacent to a constant current section of a second step, and to set a condition for changing from the constant current section of the first step to the constant voltage section of the first step and a condition for changing from the constant voltage section of the first step to the constant current section of the second step.

According to an embodiment of the disclosure, the electronic device may further include a communication circuitry (e.g., the communication module 190 of FIG. 1) that is operatively connected with the at least one processor, and the instructions may cause the processor to receive the plurality of state-of-charge reference values depending on the charging cycle of the battery from an external device through the communication circuitry and to store the plurality of state-of-charge reference values thus received, in the memory. According to an embodiment of the disclosure, the instructions may cause the processor to change at least one of the plurality of state-of-charge reference values stored in the memory.

According to an embodiment of the disclosure, a method in which an electronic device charges a battery while alternately having a plurality of constant current sections and a plurality of constant voltage sections may include charging the battery with a uniform voltage through a power management module, identifying a charging cycle of the battery, determining whether a state of charge of the battery is greater than or equal to a state-of-charge reference value corresponding to the identified charging cycle of the battery, and charging the battery with a uniform current through the power management module when the state of charge is greater than or equal to the state-of-charge reference value corresponding to the identified charging cycle.

According to an embodiment of the disclosure, the method may include charging the battery while maintaining a charging current of the battery at a first current through the power management module during a first constant current section, charging the battery while maintaining a voltage of the battery at a first voltage through the power management module during a first constant voltage section, changing from the first constant voltage section to a second constant current section when the state of charge is greater than or equal to a first state-of-charge reference value corresponding to the identified charging cycle, charging the battery while maintaining the charging current at a second current smaller in magnitude than the first current through the power management module during the second constant current section, charging the battery while maintaining the voltage at a second voltage greater in magnitude than the first voltage through the power management module during a second constant voltage section, changing from the second constant voltage section to a third constant current section when the state of charge is greater than or equal to a second state-of-charge reference value corresponding to the identified charging cycle, and charging the battery while maintaining the charging current at a third current smaller in magnitude than the second current through the power management module during the third constant current section.

According to an embodiment of the disclosure, as the charging cycle of the battery increases, the state-of-charge reference value may decrease.

According to an embodiment of the disclosure, the charging cycle of the battery may include a first cycle and a second cycle greater than the first cycle, and the method may include the following operations in the first cycle: changing from the first constant voltage section to the second constant current section when the state of charge is greater than or equal to the first state-of-charge reference value and changing from the second constant voltage section to the third constant current section when the state of charge is greater than or equal to the second state-of-charge reference value and may include the following operations in the second cycle: changing from the first constant voltage section to the second constant current section when the state of charge is greater than or equal to a third state-of-charge reference value smaller than the first state-of-charge reference value and changing from the second constant voltage section to the third constant current section when the state of charge is greater than or equal to a fourth state-of-charge reference value smaller than the second state-of-charge reference value.

According to an embodiment of the disclosure, the method may include determining whether a voltage of the battery is greater than or equal to a set voltage, and determining whether a charging current of the battery is smaller than or equal to a set current.

According to an embodiment of the disclosure, the method may include changing from a first constant voltage section to a second constant current section when the voltage is greater than or equal to the set voltage, the charging current is smaller than or equal to the set current, and the state of charge is greater than or equal to a state-of-charge reference value corresponding to the identified charging cycle of the battery.

According to an embodiment of the disclosure, the method may include determining whether a voltage of the battery reaches a target voltage, and changing from a first constant current section to a first constant voltage section when the voltage of the battery reaches the target voltage.

According to an embodiment of the disclosure, the method may be a method in which the battery is charged through the power management module depending on a plurality of steps. The method may include charging the battery while maintaining the charging current of the battery at a first current magnitude corresponding to a first step through the power management module, charging the battery while maintaining the voltage of the battery at a first voltage magnitude corresponding to the first step through the power management module, charging the battery while maintaining the charging current at a second current magnitude corresponding to a second step through the power management module, charging the battery while maintaining the voltage at a second voltage magnitude corresponding to the second step through the power management module, charging the battery while maintaining the charging current at a third current magnitude corresponding to a third step through the power management module, and charging the battery while maintaining the voltage at a third voltage magnitude corresponding to the third step through the power management module.

According to an embodiment of the disclosure, the method may include changing from the first step to the second step when the state of charge is greater than or equal to a first state-of-charge reference value corresponding to the identified charging cycle, after the charging of the battery while maintaining the voltage at the first voltage magnitude and changing from the second step to the third step when the state of charge is greater than or equal to a second state-of-charge reference value corresponding to the identified charging cycle, after the charging of the battery while maintaining the voltage at the second voltage magnitude.

According to an embodiment of the disclosure, the method may include increasing a count of the charging cycle as it is determined that the battery is fully charged.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
    a battery;
    a power management module configured to control the battery;
    a memory storing one or more instructions and a plurality of state-of-charge reference values related to a charging cycle of the battery;
    at least one processor operatively connected with the battery, the power management module, and the memory,
    wherein the at least one processor is configured to execute the one or more instructions to:
        control the power management module to charge the battery such that a charging section of the battery alternately comprises a plurality of constant current sections, in which charging is performed with a uniform current, and a plurality of constant voltage sections, in which charging is performed with a uniform voltage,
        identify the charging cycle of the battery, and
        set a condition for changing from one constant voltage section of the plurality of constant voltage sections to a constant current section following the one constant voltage section of the plurality of constant current sections, based on a state-of-charge reference value corresponding to the identified charging cycle of the battery from among the plurality of state-of-charge reference values stored in the memory, and
    wherein, as the charging cycle of the battery increases, the plurality of state-of-charge reference values decreases.

2. The electronic device of claim 1, wherein the plurality of state-of-charge reference values comprises a first state-of-charge reference value and a second state-of-charge reference value, and
    wherein the at least one processor is further configured to execute the one or more instructions to:
    identify a state of charge of the battery,
    set that the identified state of charge of the battery is greater than or equal to the first state-of-charge reference value, as a condition for changing from a first constant voltage section to a second constant current section following the first constant voltage section, and
    set that the identified state of charge of the battery is greater than or equal to the second state-of-charge reference value, as a condition for changing from a second constant voltage section to a third constant current section following the second constant voltage section.

3. The electronic device of claim 2, wherein the charging cycle of the battery comprises a first cycle and a second cycle that is greater than the first cycle,
    wherein the at least one processor is further configured to execute the one or more instructions to:
    in the first cycle,
        set that the identified state of charge of the battery is greater than or equal to the first state-of-charge reference value, as the condition for changing from the first constant voltage section to the second constant current section, and
        set that the identified state of charge of the battery is greater than or equal to the second state-of-charge reference value, as the condition for changing from the second constant voltage section to the third constant current section, and
    in the second cycle,
        set that the identified state of charge of the battery is greater than or equal to a third state-of-charge reference value smaller than the first state-of-charge reference value, as the condition for changing from the first constant voltage section to the second constant current section, and
        set that the identified state of charge of the battery is greater than or equal to a fourth state-of-charge reference value smaller than the second state-of-charge reference value, as the condition for changing from the second constant voltage section to the third constant current section.

4. The electronic device of claim 2, wherein the at least one processor is further configured to execute the one or more instructions to set a voltage of the battery and a charging current of the battery, as a condition for changing from the first constant voltage section to the second constant current section following the first constant voltage section.

5. The electronic device of claim 4, wherein the condition for changing from the first constant voltage section to the second constant current section is that the voltage of the battery is greater than or equal to a set voltage, the charging current of the battery is smaller than or equal to a set current, and the state of charge of the battery is greater than or equal to a set state-of-charge reference value.

6. The electronic device of claim 1, wherein the at least one processor is further configured to execute the one or more instructions to set a target voltage of the battery, as a condition for changing from a first constant current section to a first constant voltage section following the first constant current section, and
    wherein the condition for changing from the first constant current section to the first constant voltage section is that a voltage of the battery reaches the target voltage.

7. The electronic device of claim 1, wherein the at least one processor is further configured to execute the one or more instructions to:
    charge the battery through the power management module depending on a plurality of steps, wherein a constant current section of a first step of the plurality of steps is adjacent to a constant voltage section of the first step and the constant voltage section of the first step is adjacent to a constant current section of a second step of the plurality of steps, and
    set a condition for changing from the constant current section of the first step to the constant voltage section of the first step and a condition for changing from the constant voltage section of the first step to the constant current section of the second step.

8. The electronic device of claim 1, further comprising communication circuitry operatively connected with the at least one processor, wherein the at least one processor is further configured to execute the one or more instructions to:
receive the plurality of state-of-charge reference values depending on the charging cycle of the battery from an external device through the communication circuitry, and
store the received plurality of state-of-charge reference values in the memory.

9. The electronic device of claim 1, wherein the at least one processor is further configured to execute the one or more instructions to change at least one of the plurality of state-of-charge reference values stored in the memory.

10. A method of charging a battery of an electronic device while alternately having a plurality of constant current sections and a plurality of constant voltage sections, the method comprising:
charging the battery with a uniform voltage through a power management module of the electronic device;
identifying a charging cycle of the battery;
determining whether a state of charge of the battery is greater than or equal to a state-of-charge reference value corresponding to the identified charging cycle of the battery; and
based on the state of charge being greater than or equal to the state-of-charge reference value corresponding to the identified charging cycle, charging the battery with a uniform current through the power management module,
wherein, as the charging cycle of the battery increases, the state-of-charge reference value decreases.

11. The method of claim 10, wherein the charging the battery comprises:
in a first constant current section, charging the battery while maintaining a charging current of the battery at a first current through the power management module;
in a first constant voltage section, charging the battery while maintaining a voltage of the battery at a first voltage through the power management module;
based on the state of charge being greater than or equal to a first state-of-charge reference value corresponding to the identified charging cycle, changing from the first constant voltage section to a second constant current section;
in the second constant current section, charging the battery while maintaining the charging current at a second current smaller in magnitude than the first current through the power management module;
in a second constant voltage section, charging the battery while maintaining the voltage at a second voltage greater in magnitude than the first voltage through the power management module;
based on the state of charge being greater than or equal to a second state-of-charge reference value corresponding to the identified charging cycle, changing from the second constant voltage section to a third constant current section; and
in the third constant current section, charging the battery while maintaining the charging current at a third current smaller in magnitude than the second current through the power management module.

12. The method of claim 11, wherein the charging cycle of the battery comprises a first cycle and a second cycle that is greater than the first cycle,
wherein the charging the battery comprises:
in the first cycle,
based on the state of charge being greater than or equal to the first state-of-charge reference value, changing from the first constant voltage section to the second constant current section; and
based on the state of charge being greater than or equal to the second state-of-charge reference value, changing from the second constant voltage section to the third constant current section, and
in the second cycle,
based on the state of charge being greater than or equal to a third state-of-charge reference value smaller than the first state-of-charge reference value, changing from the first constant voltage section to the second constant current section; and
based on the state of charge being greater than or equal to a fourth state-of-charge reference value smaller than the second state-of-charge reference value, changing from the second constant voltage section to the third constant current section.

13. The method of claim 10, further comprising:
determining whether a voltage of the battery is greater than or equal to a set voltage;
determining whether a charging current of the battery is smaller than or equal to a set current; and
based on the voltage being greater than or equal to the set voltage, the charging current being smaller than or equal to the set current, and the state of charge being greater than or equal to the state-of-charge reference value corresponding to the identified charging cycle of the battery, changing from a first constant voltage section to a second constant current section.

14. The method of claim 10, further comprising:
determining whether a voltage of the battery reaches a target voltage; and
changing from a first constant current section to a first constant voltage section based on the voltage of the battery reaching the target voltage.

15. The method of claim 13, wherein the method is a method in which the battery is charged through the power management module depending on a plurality of steps, and wherein the method further comprises:
charging the battery while maintaining the charging current of the battery at a first current magnitude corresponding to a first step through the power management module;
charging the battery while maintaining the voltage of the battery at a first voltage magnitude corresponding to the first step through the power management module;
charging the battery while maintaining the charging current at a second current magnitude corresponding to a second step through the power management module;
charging the battery while maintaining the voltage at a second voltage magnitude corresponding to the second step through the power management module;
charging the battery while maintaining the charging current at a third current magnitude corresponding to a third step through the power management module; and
charging the battery while maintaining the voltage at a third voltage magnitude corresponding to the third step through the power management module.

16. The method of claim 15, further comprising:
changing from the first step to the second step based on the state of charge being greater than or equal to a first state-of-charge reference value corresponding to the identified charging cycle, after the charging of the battery while maintaining the voltage at the first voltage magnitude; and
changing from the second step to the third step based on the state of charge is greater than or equal to a second state-of-charge reference value corresponding to the identified charging cycle, after the charging of the battery while maintaining the voltage at the second voltage magnitude.

17. The method of claim 16, further comprising: increasing a count of the charging cycle based on determining that the battery is fully charged.

18. A non-transitory computer-readable medium having recorded thereon computer-executable instructions, which when executed, cause an electronic device to execute a method of charging a battery of the electronic device while alternately having a plurality of constant current sections and a plurality of constant voltage sections, the method comprising:
- charging the battery with a uniform voltage through a power management module of the electronic device;
- identifying a charging cycle of the battery;
- determining whether a state of charge of the battery is greater than or equal to a state-of-charge reference value corresponding to the identified charging cycle of the battery; and
- based on the state of charge being greater than or equal to the state-of-charge reference value corresponding to the identified charging cycle, charging the battery with a uniform current through the power management module,
- wherein, as the charging cycle of the battery increases, the state-of-charge reference value decreases.

* * * * *